(12) United States Patent
Miyaji et al.

(10) Patent No.: US 6,710,652 B2
(45) Date of Patent: Mar. 23, 2004

(54) FEEDFORWARD AMPLIFIER

(75) Inventors: Masayuki Miyaji, Yokohama (JP);
Kaoru Ishida, Shijonawate (JP);
Toshimitsu Matsuyoshi, Katano (JP);
Seiji Fujiwara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 142 days.

(21) Appl. No.: 09/961,144

(22) Filed: Sep. 21, 2001

(65) Prior Publication Data

US 2002/0113648 A1 Aug. 22, 2002

(30) Foreign Application Priority Data

Sep. 22, 2000 (JP) ........................................ 2000-289539

(51) Int. Cl.[7] .................................................. H03F 1/00
(52) U.S. Cl. ........................................ 330/151; 330/149
(58) Field of Search ................................ 330/149, 151, 330/51

(56) References Cited

U.S. PATENT DOCUMENTS

| | | | | |
|---|---|---|---|---|
| 4,617,522 A | * | 10/1986 | Tarbutton et al. | ............ 330/149 |
| 6,069,527 A | * | 5/2000 | Maruyama | .................... 330/51 |
| 6,489,844 B2 | * | 12/2002 | Yamashita et al. | ............ 330/52 |

* cited by examiner

Primary Examiner—Henry Choe
(74) Attorney, Agent, or Firm—RatnerPrestia

(57) ABSTRACT

A feedforward amplifier includes a first power splitter for dividing an input signal into two paths. The first path, in sequence, includes a first vector adjuster, a main amplifier, a second power splitter and a delay circuit. The second path, in sequence, includes a delay circuit, a distortion detecting power combiner, a second vector adjuster and an error amplifier. The distortion detecting power combiner combines a portion of a signal from the first path with a signal in the second path. Each vector adjuster adjusts amplitude and phase of a signal in each path. A distortion suppression power combiner synthesizes a signal in the first path with a signal in the second path. Control is included for stopping operation of the error amplifier or main amplifier based on a predetermined condition.

18 Claims, 13 Drawing Sheets

Port a

Port d

Port i

Port m

FEEDFORWARD AMPLIFIER

BACKGROUND OF THE INVENTION

1. Field of the Invention

The invention relates to a feedforward amplifier and a communication equipment, which are primarily used for a base station device of mobile communication equipment.

2. Related Art of the Invention

In recent years, a high-output linear power-amplifier, compensated for distortion by a feedforward method, has been used for a base station device of mobile communication equipment.

FIG. 12 shows an example of the configuration of a conventional feedforward amplifier. In FIG. 12, reference numeral 1 denotes an input terminal, 2 an output terminal, 3 and 8 power splitters, 4 and 9 power-combiners, 5 and 13 vector adjustors, 6 a main amplifier, 7 and 10 delay circuits, and 14 an error amplifier, respectively. Further, symbols a to k and m added to the power splitters 3 and 8 and the power-combiners 4 and 9 show respective ports.

Hereinafter, the operation of the feedforward amplifier configured as described above will be described.

First, an input signal input from the input terminal 1 and including a plurality of carrier frequency components is split into two parts by the power splitter 3, and the two parts are output from the port b and port c respectively. The signal output from the port b is amplified by the main amplifier 6 through the vector adjustor 5, and then passes through the power splitter 8 and the delay circuit 10, inputting into the port j of the power-combiner 4. At this time, the signal including distortion components caused by intermodulation due to non-linearity of the main amplifier 6 in addition to the carrier frequency components are input into the port j.

Further, part of the output signal of the main amplifier 6 is took out from a port f of the power splitter 8 and input into a port h of the power-combiner 9. On the other hand, the signal output from the port c inputs into a port g of the power-combiner 9 through the delay circuit 7. Here, the vector adjustor 5 and delay circuit 7 are adjusted such that the carrier frequency components of the respective signals input into the port g and the port h may have the same amplitudes and opposite phases, thereby a signal having only the distortion components with the carrier frequency components canceled out being output from the port i.

Next, the signal output from the port i is amplified by the error amplifier 14 through the vector adjustor 13 and inputs into a port k of the power-combiner 4. Here, the vector adjustor 13 and the delay circuit 10 are adjusted such that the distortion components of signals input into the port j and port k may have the same amplitudes and opposite phases, thereby a signal having only the carrier frequency components with the distortion components canceled out being output from a port m of the power-combiner 4 to the output terminal 2.

FIGS. 13(a) to (d) shows frequency spectra of signals at the ports a, d, i and m.

As shown in FIG. 13(a), the frequency spectrum of the signal at the port a is composed of carrier frequency components. Also, as shown in FIG. 13(b), the frequency spectrum of the signal at the port d is composed of carrier frequency components and distortion components. Further, as shown in FIG. 13(c), the frequency spectrum of the signal at the port i is composed of only the distortion components with the carrier frequency components canceled out.

Further, as shown in FIG. 13(d), the frequency spectrum of the signal from the port m is composed of only the carrier frequency components with the distortion components canceled out.

However, the configuration of FIG. 12 has a problem that a decrease in output power leads to a decrease in efficiency as shown in FIG. 14. Here, the efficiency means the ratio of output power to consumption power.

Further, in a base station device and the like of mobile communication equipment that uses the configuration of FIG. 12, there is a problem that when the main amplifier fails, the device can not work and thus the communication stops completely.

SUMMARY OF THE INVENTION

Considering the above problems, the invention has an object to provide a feedforward amplifier and a communication equipment of which efficiency does not decrease even in the event of the reduction of output power.

Further, the invention has another object to provide a feedforward amplifier and a communication equipment of which communication does not stop completely even in the event of the failure of the main amplifier.

One aspect of the present invention is a feedforward amplifier comprising:

a first power splitter for splitting an input signal into two parts;

a first vector adjustor for adjusting the amplitude and phase of one output signal of said first power splitter;

a main amplifier for amplifying an output signal of said first vector adjustor;

a second power splitter for splitting an output signal of said main amplifier into two parts;

a first delay circuit for delaying the other output signal of said first power splitter;

a distortion detection power-combiner for synthesizing one output signal of said second power splitter and an output signal of said first delay circuit;

a second delay circuit for delaying the other output signal of said second power splitter;

a second vector adjustor for adjusting the amplitude and phase of the output signal of said distortion detection power-combiner;

an error amplifier for amplifying the output signal of said second vector adjustor;

a distortion suppression power-combiner for synthesizing the output signal of said second delay circuit and the output signal of said error amplifier; and control means of at least stopping the operation of said error amplifier or said main amplifier depending on a predetermined condition.

Another aspect of the present invention is the feedforward amplifier, further comprising:

first signal level detection means of detecting a first signal level that is the signal level of said input signal, or the signal level of a baseband signal in a baseband signal generating portion, or the signal level of a transmitting signal in a transmitting circuit, wherein said predetermined condition represents said first signal level, and when said detected first signal level is not higher than a predetermined value, said control means stops the operation of said error amplifier.

Still another aspect of the present invention is the feedforward amplifier, further comprising:

first signal level detection means of detecting a first signal level that is the signal level of a received signal in a receiving circuit, wherein said predetermined condition represents said first signal level, and when said detected first signal level is not lower than a predetermined value, said control means stops the operation of said error amplifier.

Yet still another aspect of the present invention is the feedforward amplifier, further comprising:

first signal level detection means of detecting a first signal level that is the signal level of said input signal, or the signal level of a baseband signal in a baseband signal generating portion, or the signal level of a transmitting signal in a transmitting circuit, or the signal level of a received signal in a receiving circuit; and second signal level detection means of detecting a second signal level that is the signal level of said output signal, wherein said predetermined condition represents gain of said second signal level to said first signal level, and when said gain is out of a predetermined value, said control means stops the operation of said main amplifier.

Still yet another aspect of the present invention is the feedforward amplifier, further comprising:

first signal level detection means of detecting a first signal level that is the signal level of an input signal, or the signal level of a baseband signal in a baseband signal generating portion, or the signal level of a transmitting signal in a transmitting circuit, wherein said predetermined condition represents said first signal level, and when said first signal level is not higher than a predetermined value, said control means stops the operation of said main amplifier.

A further aspect of the present invention is the feedforward amplifier, further comprising:

first signal level detection means of detecting a first signal level that is the signal level of a received signal in a receiving circuit, wherein said predetermined condition represents said first signal level, and when said first signal level is not lower than a predetermined value, said control means stops the operation of said main amplifier.

A still further aspect of the present invention is the feedforward amplifier, wherein said distortion suppression power-combiner is a variable power-combiner that can have a tight coupling state and a loose coupling state, and when said first signal level is higher than a predetermined value, said control means controls said variable power-combiner to have said loose coupling state, and when said first signal level is not higher than the predetermined value, said control means controls said variable power-combiner to have said tight coupling state.

A yet further aspect of the present invention is the feedforward amplifier, wherein said distortion suppression power-combiner is a variable power-combiner that can have a tight coupling state and a loose coupling state, when said first signal level is lower than a predetermined value, said control means controls said variable power-combiner to have said loose coupling state, and when said first signal level is not lower than the predetermined value, said control means controls said variable power-combiner to have said tight coupling state.

A still yet further aspect of the present invention is the feedforward amplifier, wherein, when said first signal level is not higher than a predetermined value, said control means performs such control that the output signal of said error amplifier can be output without passing through said distortion suppression power-combiner.

An additional aspect of the present invention is the feedforward amplifier, wherein, when said first signal level is not lower than a predetermined value, said control means performs such control that the output signal of said error amplifier can be output without passing through said distortion suppression power-combiner.

A still additional aspect of the present invention is the feedforward amplifier, further comprising:

first signal level detection means of detecting a first signal level that is the signal level of an input signal, or the signal level of a baseband signal in a baseband signal generating portion, or the signal level of a transmitting signal in a transmitting circuit, wherein said predetermined condition represents said first signal level, and when said first signal level is not higher than a first predetermined value and higher than a second predetermined value that is smaller than said first predetermined value, said control means stops the operation of said error amplifier, and when said first signal level is not higher than said second predetermined value, said control means stops the operation of said main amplifier.

A yet additional aspect of the present invention is the feedforward amplifier, further comprising:

first signal level detection means of detecting a first signal level that is the signal level of a received signal in a receiving circuit, wherein said predetermined condition represents said first signal level, and when said first signal level is not higher than a first predetermined value and higher than a second predetermined value that is smaller than said first predetermined value, said control means stops the operation of said error amplifier, and when said first signal level is not lower than said first predetermined value, said control means stops the operation of said main amplifier.

A still yet additional aspect of the present invention is the feedforward amplifier, further comprising:

a third power splitter for splitting the output signal of said error amplifier into two parts;

a third delay circuit for delaying one output signal of said third power splitter;

a fourth power splatter for splitting the output signal of said distortion suppression power-combiner into two parts;

a fourth delay circuit for delaying one output signal of said fourth power splitter;

a second distortion detection power-combiner for synthesizing the output signal of said fourth delay circuit and the other output signal of said third power splitter;

a third vector adjustor for adjusting the amplitude and phase of the output signal of said second distortion detection power-combiner;

a second error amplifier for amplifying the output signal of said third vector adjustor;

a second distortion suppression power-combiner for synthesizing the output signal of said third delay circuit and the output signal of said second error amplifier; and first signal level detection means of detecting a first signal level that is the signal level of said input signal, or the signal level of a baseband signal in a baseband signal generating portion, or the signal of a transmitting signal in a transmitting circuit, wherein said control means also stops the operation of said second error amplifier depending on said predetermined condition, said predetermined condition represents said first signal level, and when said first signal level is higher than a predetermined value, said control means stops the operation of said second error amplifier and performs such control that the output signal of said error amplifier can not be input by said third power splitter, and performs such control that the output signal of said distortion suppression power-combiner can be output to the outside, and when said first signal level is not higher than the predetermined value, said control means stops the operation of said main amplifier and performs such control that the output signal of said error amplifier can not be input by said distortion suppression power-combiner but can be input by said third power splitter, and performs such control that the output signal of said second distortion suppression power-combiner can be output to the outside.

A supplementary aspect of the present invention is the feedforward amplifier, further comprising:

a third power splitter for splitting the output signal of said error amplifier into two parts;

a third delay circuit for delaying one output signal of said third power splitter;

a fourth power splitter for splitting the output signal of said distortion suppression power-combiner into two parts;

a fourth delay circuit for delaying one output signal of said fourth power splitter;

a second distortion detection power-combiner for synthesizing the output signal of said fourth delay circuit and the other output signal of said third power splitter;

a third vector adjustor for adjusting the amplitude and phase of the output signal of said second distortion detection power-combiner;

a second error amplifier for amplifying the output signal of said third vector adjustor;

a second distortion suppression power-combiner for synthesizing the output signal of said third delay circuit and the output signal of said second error amplifier; and first signal level detection means of detecting a first signal level that is the signal level of a received signal in a receiving circuit, wherein said control means also stops the operation of said second error amplifier depending on said predetermined condition, said predetermined condition represents said first signal level, and when said first signal level is lower than a predetermined value, said control means stops the operation of said second error amplifier and performs such control that the output signal of said error amplifier can not be input by said third power splitter, and performs such control that the output signal of said distortion suppression power-combiner can be output to the outside, and when said first signal level is not lower than the predetermined value, said control means stops the operation of said main amplifier and performs such control that the output signal of said error amplifier can not be input by said distortion suppression power-combiner but can be input by said third power splitter, and performs such control that the output signal of said second distortion suppression power-combiner can be output to the outside.

A still supplementary aspect of the present invention is the feedforward amplifier, further comprising:

a third power splitter for splitting the output signal of said error amplifier into two parts;

a third delay circuit for delaying one output signal of said third power splitter;

a fourth power splitter for splitting the output signal of said distortion suppression power-combiner into two parts;

a fourth delay circuit for delaying one output signal of said fourth power splitter;

a second distortion detection power-combiner for synthesizing the output signal of said fourth delay circuit and the other output signal of said third power splitter;

a third vector adjustor for adjusting the amplitude and phase of the output signal of said second distortion detection power-combiner;

a second error amplifier for amplifying the output signal of said third vector adjustor;

a second distortion suppression power-combiner for synthesizing the output signal of said third delay circuit and the output signal of said second error amplifier; and first signal level detection means of detecting a first signal level that is the signal level of said input signal, or the signal level of a baseband signal in a baseband signal generating portion, or the signal of a transmitting signal in a transmitting circuit, wherein said control means also stops the operation of said second error amplifier depending on said predetermined condition, said predetermined condition represents said first signal level, and when said first signal level is higher than a predetermined value, said control means stops the operation of said second error amplifier and performs such control that the output signal of said error amplifier can not be input by said third power splitter, and performs such control that the output signal of said distortion suppression power-combiner can be output to the outside, and when said first signal level is not higher than the first predetermined value and higher than a second predetermined value that is smaller than said first predetermined value, said control means stops the operation of said main amplifier and performs such control that the output signal of said error amplifier can not be input by said distortion suppression power-combiner but can be input by said third power splitter, and performs such control that the output signal of said second distortion suppression power-combiner can be output to the outside, and when said first signal level is not higher than the second predetermined value, said control means stops the operation of said error amplifier and stops the operation of said second error amplifier, and performs such control that the output signal of said distortion suppression power-combiner can be output to the outside.

A yet supplementary aspect of the present invention is the feedforward amplifier, further comprising:

a third power splitter for splitting the output signal of said error amplifier into two parts;

a third delay circuit for delaying one output signal of said third power splitter;

a fourth power splitter for splitting the output signal of said distortion suppression power-combiner into two parts;

a fourth delay circuit for delaying one output signal of said fourth power splitter;

a second distortion detection power-combiner for synthesizing the output signal of said fourth delay circuit and the other output signal of said third power splitter;

a third vector adjustor for adjusting the amplitude and phase of the output signal of said second distortion detection power-combiner;

a second error amplifier for amplifying the output signal of said third vector adjustor;

a second distortion suppression power-combiner for synthesizing the output signal of said third delay circuit and the output signal of said second error amplifier; and first signal level detection means of detecting a first signal level that is the signal level of a received signal in a receiving circuit, wherein said control means also stops the operation of said second error amplifier depending on said predetermined condition, said predetermined condition represents said first signal level, and when said first signal level is lower than a second predetermined value, said control means stops the operation of said second error amplifier and performs such control that the output signal of said error amplifier can not be input by said third power splitter, and performs such control that the output signal of said distortion suppression power-combiner can be output to the outside, and when said first signal level is not higher than a first predetermined value that is larger than said second predetermined value and higher than said second predetermined value, said control means stops the operation of said main amplifier and performs such control that the output signal of said error amplifier can not be input by said distortion suppression power-combiner but can be input by said third power splitter, and performs such control that the output signal of said second distortion suppression power-combiner can be output to the outside, and when said first signal level is not lower than the first predetermined value, said control means stops the operation of said error amplifier and stops the operation of said second error amplifier, and performs such control that the output signal of said distortion suppression power-combiner can be output to the outside.

A still yet supplementary aspect of the present invention is the feedforward amplifier, wherein said first signal level detection means is provided in an upstream stage of said first power splitter, or between said first power splitter and said first vector adjustor, or between said first vector adjustor and said main amplifier, or between said first power splitter and said first delay circuit, or between said first delay circuit and said distortion detection power-combiner, or at the input of said baseband signal generating portion, or at the output of said baseband signal generating portion, or in said baseband signal generating potion, or at the input of said transmitting circuit, or at the output of said transmitting circuit, or in said transmitting circuit.

Another aspect of the present invention is the feedback amplifier, wherein said first signal level detection means is provided at the input of said receiving circuit, or at the output of said receiving circuit, or in said receiving circuit.

Still another aspect of the present invention is the feedforward amplifier, wherein said second signal level detection means is provided in a downstream stage of said distortion suppression power-combiner, or between said second power splitter and said second delay circuit, or between said second delay circuit and said distortion suppression power-combiner.

Yet still another aspect of the present invention is the feedforward amplifier, wherein said first signal level is the signal level of said input signal, and when said first signal level detection means detects the signal level of said input signal, said first signal level detection means has a signal level detection power-splitter for splitting said input signal into two parts and detection means of detecting said signal level of one output signal of said signal level detection power-splitter, and the other output signal of said signal level detection power splitter is supplied to a downstream stage.

Still yet another aspect of the present invention is the feedforward amplifier, wherein said second signal level detection means has a signal level detection power-splitter for splitting said output signal into two parts and detection means of detecting said signal level of one output signal of said signal level detection power-splitter, and the other output signal of said signal level detection power-splitter is supplied to a downstream stage.

A further aspect of the present invention is the feedforward amplifier, wherein the stopping of the operation of said error amplifier is to perform such control that the power supply for said error amplifier can be turned off and/or to perform such control that the output signal of said second vector adjustor can not be input by said error amplifier.

A still further aspect of the present invention is the feedforward amplifier, wherein the stopping of the operation of said main amplifier is to perform such control that the power supply for said main amplifier can be turned off and/or to perform such control that the output signal of said first vector adjustor can not be input by said main amplifier.

A yet further aspect of the present invention is the feedforward amplifier, wherein the stopping of the operation of said second error amplifier is to perform such control that the power supply for said second error amplifier can be turned off and/or to perform such control that the output signal of said third vector adjustor can not be input by said secondary error amplifier.

A still yet further aspect of the present invention is a communication equipment comprising:

a transmitting circuit for outputting a transmitting signal from said baseband signal generated, wherein the feedforward amplifier is used for said transmitting circuit.

In the feedforward amplifier according to the invention, because the level of distortion caused by the main amplifier is low at low output power, output signals of the main amplifier are then output as-is from the output terminal of the distortion suppression power-combiner, and further the power source of the error amplifier is turned off to allow the high efficiency of the feedforward amplifier.

Further, when an abnormal event occurs in the main amplifier, the error amplifier can be used to amplify and output the input signal, thereby allowing the improved reliability of the feedforward amplifier.

Furthermore, equipping communication equipments such as mobile communication equipments with the feedforward amplifier according to the invention allows the higher efficiency and improved reliability of communication equipments such as mobile communication equipments.

DESCRIPTION OF SYMBOLS

Figure 1:
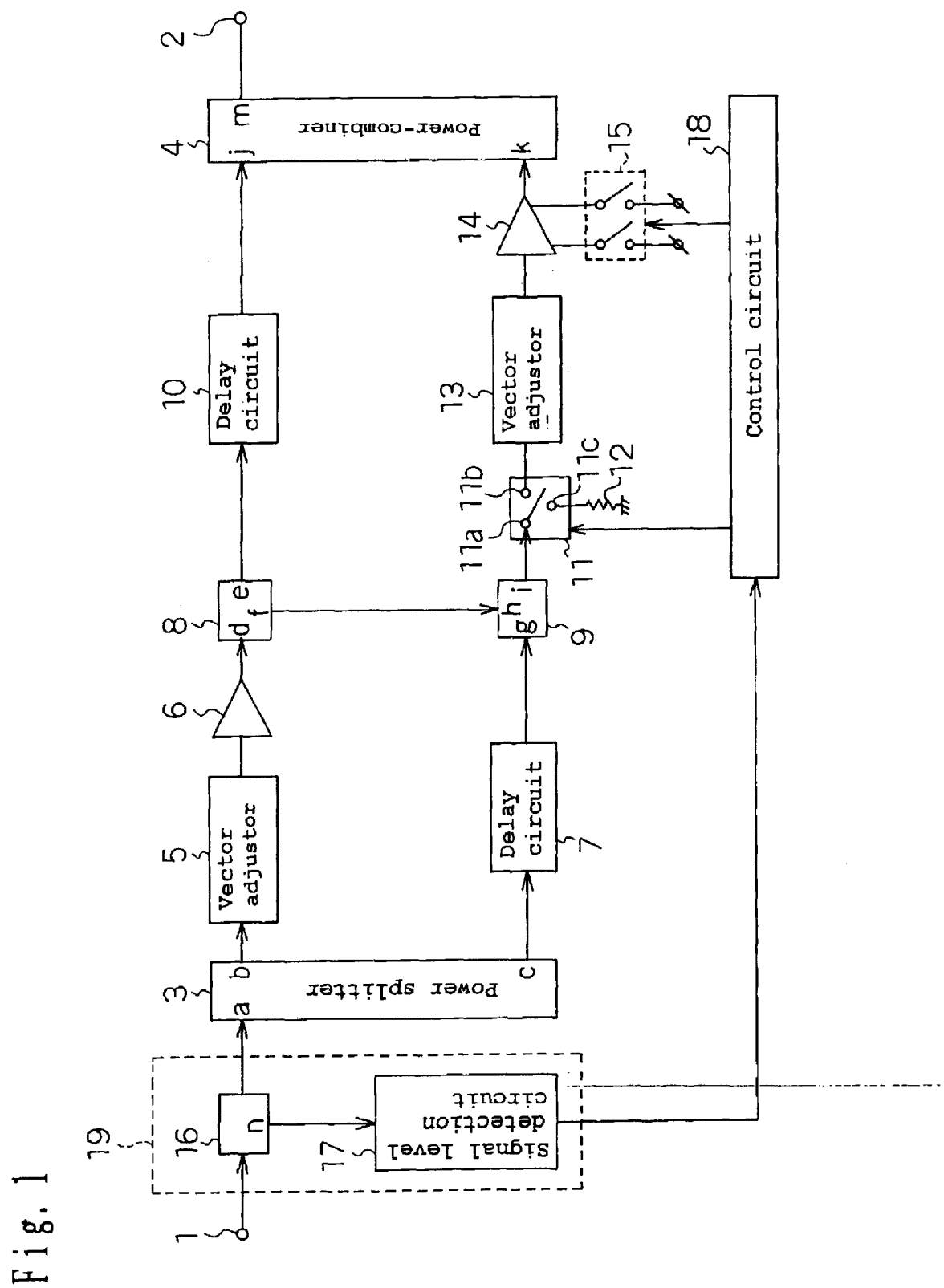
FIG. 1 shows a configuration diagram of the feedforward amplifier according to the embodiment 1.

1 . . . Input terminal
2 . . . Output terminal
3, 8, 16, 26, 31, 36 . . . Power splitter
4, 9, 32, 37 . . . Power-combiner
5, 13, 39 . . . Vector adjustor
6 . . . Main amplifier
7, 10, 35, 38 . . . Delay circuit
11, 21, 24, 25, 33 . . . Switch circuit
12, 22, 34 . . . Terminating resistor
14 . . . Error amplifier
15 . . . Error amplifier power switch circuit
17, 27 . . . Signal level detection circuit
18 . . . Control circuit
19, 29 . . . Signal level detection portion
20 . . . Variable power-combiner
23 . . . Main amplifier power-switch-circuit
40 . . . Power amplifier
41 . . . Power amplifier power switch circuit 42 . . . First feedforward amplifier circuit
43 . . . Second feedforward amplifier circuit

PREFERRED EMBODIMENTS OF THE INVENTION

Hereinafter, the embodiments of the invention will be described with reference to the drawings.

Figure 12:
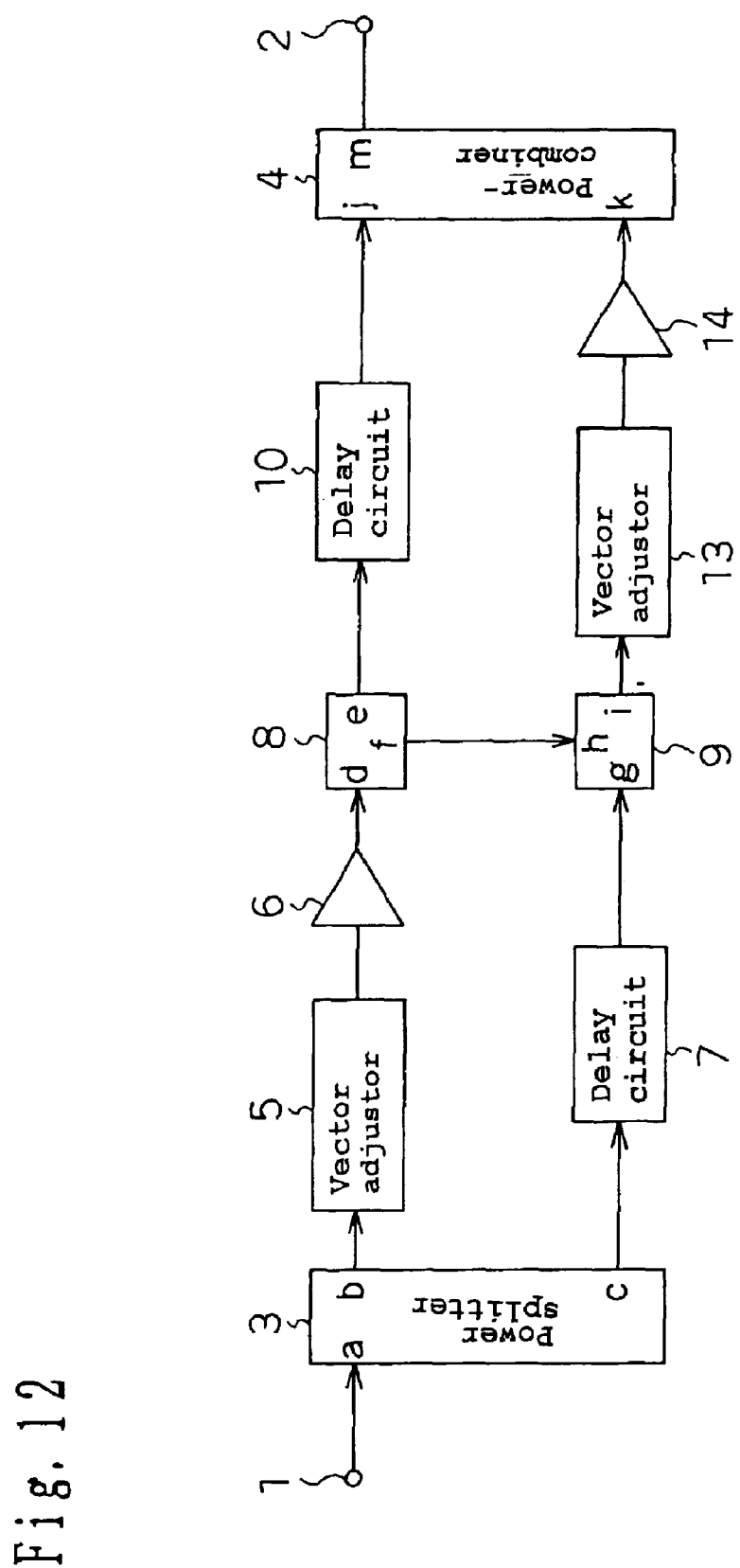
FIG. 12 shows a configuration diagram of a conventional feedforward amplifier.
Figure 13:
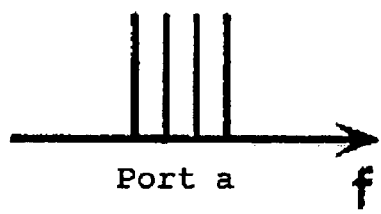
FIG. 13 shows a frequency spectrum of signals at the ports a, d, i, and m of FIG. 12.
Figure 13:
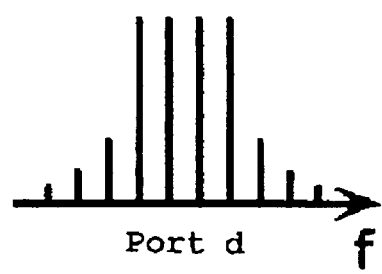
Figure 13:
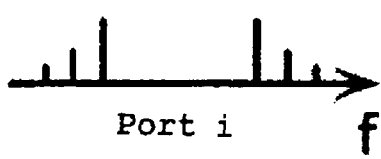
Figure 13:
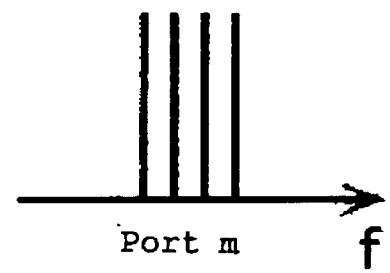
Figure 14:
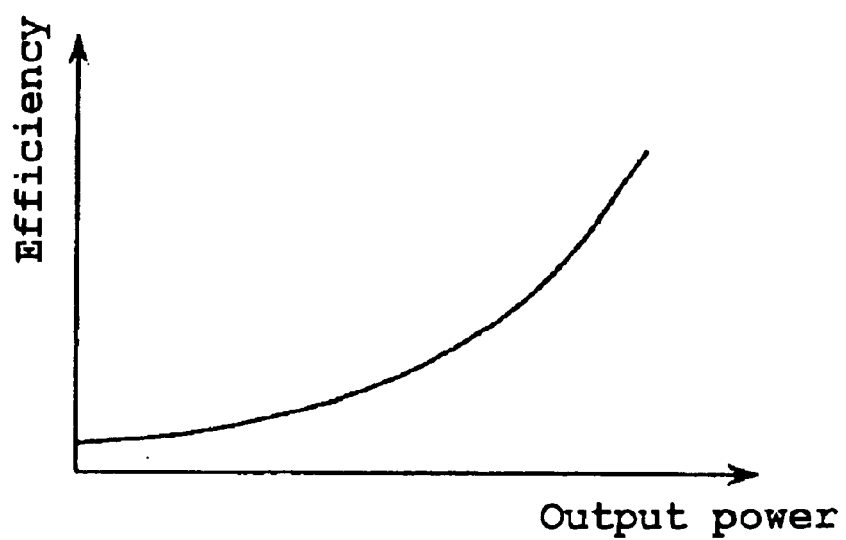
FIG. 14 shows a characteristic diagram of efficiency versus output power of a conventional feedforward amplifier.

Here, the same components as the conventional feedforward amplifier of FIG. 12 are denoted by the same symbols.

(Embodiment 1)

FIG. 1 shows a configuration diagram of the feedforward amplifier according to the embodiment 1 of the invention. In FIG. 1, reference numeral 11 denotes a switch circuit, 12 a terminating resistor, 15 an error amplifier power switch, 16 a power splitter, 17 a signal level detection circuit, and 18 a control circuit for switching the switch circuit 11 and the error amplifier power switch circuit 15 depending on the signal level detected by the signal level detection circuit 17, respectively. The power splitter 16 and the signal level detection circuit 17 constitute a signal level detection portion 19. Further, a symbol n added to the power splitter 16 shows a port.

By the way, the power splitter 3 of the present embodiment is an example of the first power splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 13 an example of the second vector adjustor, the power-combiner 4 an example of the distortion suppression power-combiner, the control circuit 18 an example of the control means, and the signal level detection portion 19 an example of the first signal level detection means, respectively.

For the feedforward amplifier configured as described above, hereinafter, its operation will be described with reference to the drawings.

An input signal input from an input terminal 1 and including a plurality of carrier frequency components is input into a port a of the power splitter 3 through the power splitter 16. Then, part of the input signal is took out from the port n of the power splitter 16 and input into the signal level detection circuit 17. The signal input into the port a of the power splitter 3 is split into two parts, which are output through a port b and port c respectively.

The signal output from the port b is amplified by the main amplifier 6 through the vector adjustor 5 and then input into a port j of the power-combiner 4 through the power splitter 8 and the delay circuit 10. At this time, signals including distortion components caused by intermodulation due to the non-linearity of the main amplifier 6 in addition to the carrier frequency components are input into the port j.

Further, part of the output signal of the main amplifier 6 is took out from a port f of the power splitter 8 and input into a port h of the power-combiner 9. On the other hand, the signal output from the port c is input into a port g of the power-combiner 9 through the delay circuit 7.

Here, the vector adjustor 5 and the delay circuit 7 are adjusted such that the carrier frequency components of the signals input into the port g and the port h may have the same amplitudes and opposite phases, thereby a signal having only the distortion components with the carrier frequency components canceled out being output from the port i.

Then, the signal output from the port i is input into a common terminal 11a of the switch circuit 11. Here, when the input signal level detected by the signal level detection circuit 17 is higher than P1 (dBm), the control circuit 18 connects the common terminal 11a to an output switching terminal 11b of the switch circuit 11, and further turns on the error amplifier power switch circuit 15. On the other hand, when the input signal level is not higher than P1 (dBm), the control circuit 18 connects the common terminal 11a to an output switching terminal 11c of the switch circuit 11 and further turns off the error amplifier power switch circuit 15.

First, when the input signal level is higher than P1 (dBm), the signal input into the common terminal 11a of the switch circuit 11 is amplified by the error amplifier 14 through the output switching terminal 11b and the vector adjustor 13, and then input into a port k of the power-combiner 4. Here, the vector adjustor 13 and the delay circuit 10 are adjusted such that the distortion components of the signals input into the port j and the port k may have the same amplitudes and opposite phases, thereby a signal having only the carrier frequency components with the distortion components canceled out being output from a port m of the power-combiner 4 into an output terminal 2.

On the other hands when the input signal level is not higher than P1 (dBm), the signal input into the common terminal 11a of the switch circuit 11 is absorbed by a terminating resistor 12 through the output switching terminal 11c. For this reason, no signal is input into the port k of the power-combiner 4, and the signal input into the port j of the power-combiner 4 is output as-is from the port m to the output terminal 2. That is, the output signal of the main amplifier 6 is output as-is from the output terminal 2.

Figure 2:
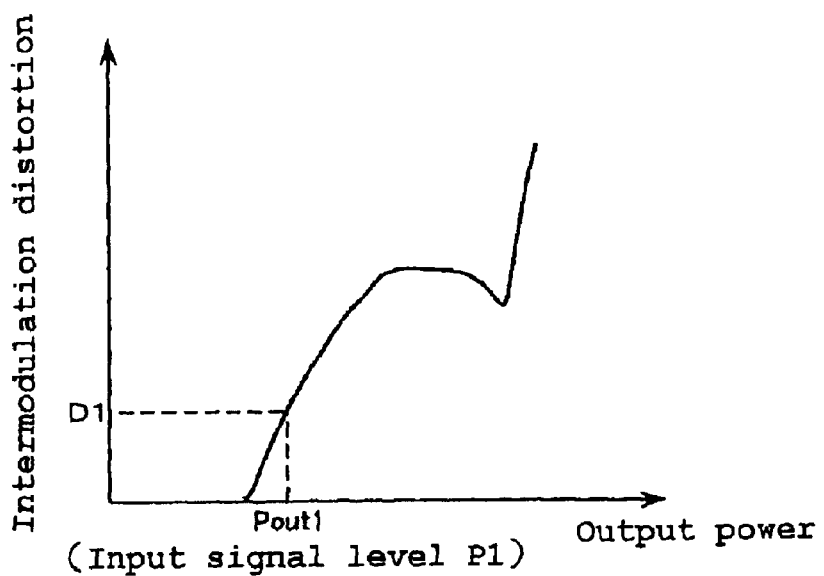
FIG. 2 shows a characteristic diagram of distortion versus output power of a main amplifier.
Figure 3:
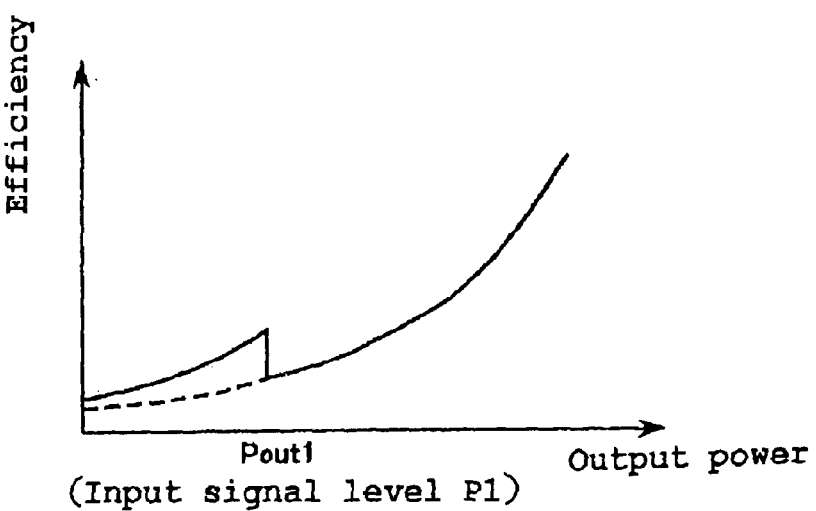
FIG. 3 shows a characteristic diagram of efficiency versus output power of the feedforward amplifier according to the embodiment 1 of the invention.

Generally, the level of distortions caused by the main amplifier 6 decreases as its output power decreases as shown in FIG. 2. When the level of distortions included in the output signals of the main amplifier 6 is not higher than D1 (e.g. −60 dBc) (wherein the input signal level corresponds to P1 (dBm)), it is no problem to output the as-is output signal of the main amplifier 6 to the output terminal 2. At this time, because the error amplifier power switch circuit 15 is turned off, the power consumed by the error amplifier 14 becomes zero, therefore allowing improvement of the efficiency at low output power as shown in FIG. 3.

By the way, in the above embodiment, although the input signal level is used to switch the switch circuit 11 and the error amplifier power switch circuit 15, it is apparent that the same operation can be also obtained by switching them depending on the level of signals output from the port b of the power splitter 3, the vector adjustor 5, the port f of the power splitter 8, the port c of the power splitter 3, or the delay circuit 7. In this case, the signal level detection portion 19 should be inserted in the position for the signal level to be detected.

(Embodiment 2)

Figure 4:
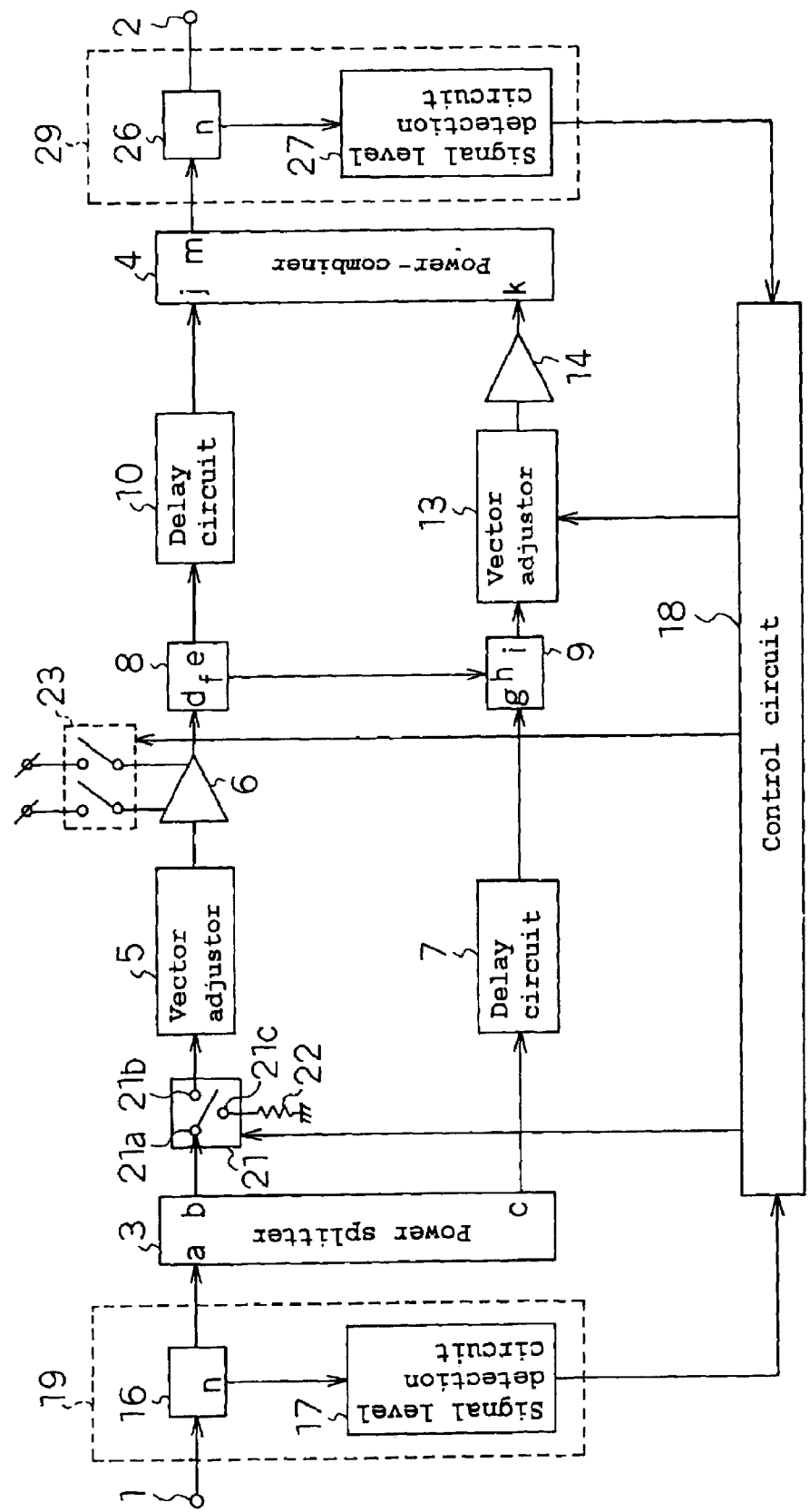
FIG. 4 shows a configuration diagram of the feedforward amplifier according to the embodiment 2 of the invention.

FIG. 4 shows a configuration diagram of the feedforward amplifier according to the embodiment 2 of the invention. In FIG. 4, reference numeral 21 denotes a switch circuit, 22 a terminating resistor, 23 a main amplifier power-switch-circuit, 26 a power splitter, and 27 a signal level detection circuit, respectively. The power splitter 26 and the signal level detection circuit 27 constitute a signal level detection portion 29.

The control circuit 18 switches the switch circuit 21 and the main amplifier power-switch-circuit 23 and adjusts the vector adjustor 13, depending on the signal level detected by the signal level detection circuits 17 and 27.

By the way, the power splitter 3 of the present embodiment is an example of the first power splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 13 an example of the second vector adjustor, the power-combiner 4 an example of the distortion suppression power-combiner, the control circuit 18 an example of the control means, the signal level detection portion 19 an example of the first signal level detection means, and the signal level detection portion 29 an example of the second signal detection means, respectively.

With feedforward amplifier configured as described above, its operation will be described with reference to the drawing.

The embodiment 2 according to of the invention provides a feedforward amplifier in which, when an abnormal event occurs in the main amplifier 6; the error amplifier 14 directly amplifies input signals for outputting. When the main amplifier 6 normally operates, a difference between the output signal level detected by the signal level detection portion 29 and the input signal level detected by the signal level detection portion 19 (the gain of the feedforward amplifier) is kept constant. However, the signal level difference between the output signal and the input signal is out of the constant value, the main amplifier is then judged to be abnormal.

When the main amplifier 6 operates normally, the control circuit 18 directly connects a common terminal 21a to an output switching terminal 21b of the switch circuit 21 and also turns on the main amplifier power-switch-circuit 23. At this time, the feedforward amplifier according to the embodiment 2 of the invention performs the same operation as conventional feedforward amplifiers.

On the other hand, when an abnormal event occurs in the main amplifier 6, the control circuit 18 connects the common terminal 21a to an output switching terminal 21c of the switch circuit 21 and turns off the main amplifier power-switch-circuit 23.

At this time, an input signal input from the input terminal 1 and including a plurality of carrier frequency components is split into two parts by the power splitter 3 through the power splitter 16 and the two parts are output from the port b and port c respectively. The signal output from the port b is absorbed by the terminating resistor 22. Further, the signal output from the port c is amplified by the error amplifier 14 through the delay circuit 7, power-combiner 9, and vector adjustor 13.

At this time, in the power-combiner 9, because no signal is input into the port h, the signal input into the port g is output as-is from the port i. The signal amplified by the error amplifier 14 is output from the output terminal 2 through the power-combiner 4 and power splitter 26.

At this time, in the power-combiner 4, because no signal is input into the port j, the signal input into the port k is output as-is from the port m.

That is, the output terminal 2 outputs the as-is output signal of the error amplifier 14. In this case, the control circuit 18 adjusts the vector adjustor 13 to control the level of signals input into the error amplifier 14.

When the feedforward amplifier according to the embodiment 2 is used for a mobile communication equipment, even if the main amplifier 6 fails, the direct amplification by the error amplifier 14 allows the device to continue operating its function though with reduced maximum output power, thereby achieving the improved reliability of the whole mobile communication equipment.

By the way, although the present embodiment is described for the case where the signal level detection portion 29 is provided in a downstream stage of the power-combiner 4, the embodiment is not limited to this. The signal level detection portion 29 may be provided between the power splitter 8 and the delay circuit 10, or between the power circuit 10 and the power-combiner 4.

(Embodiment 3)

Figure 5:
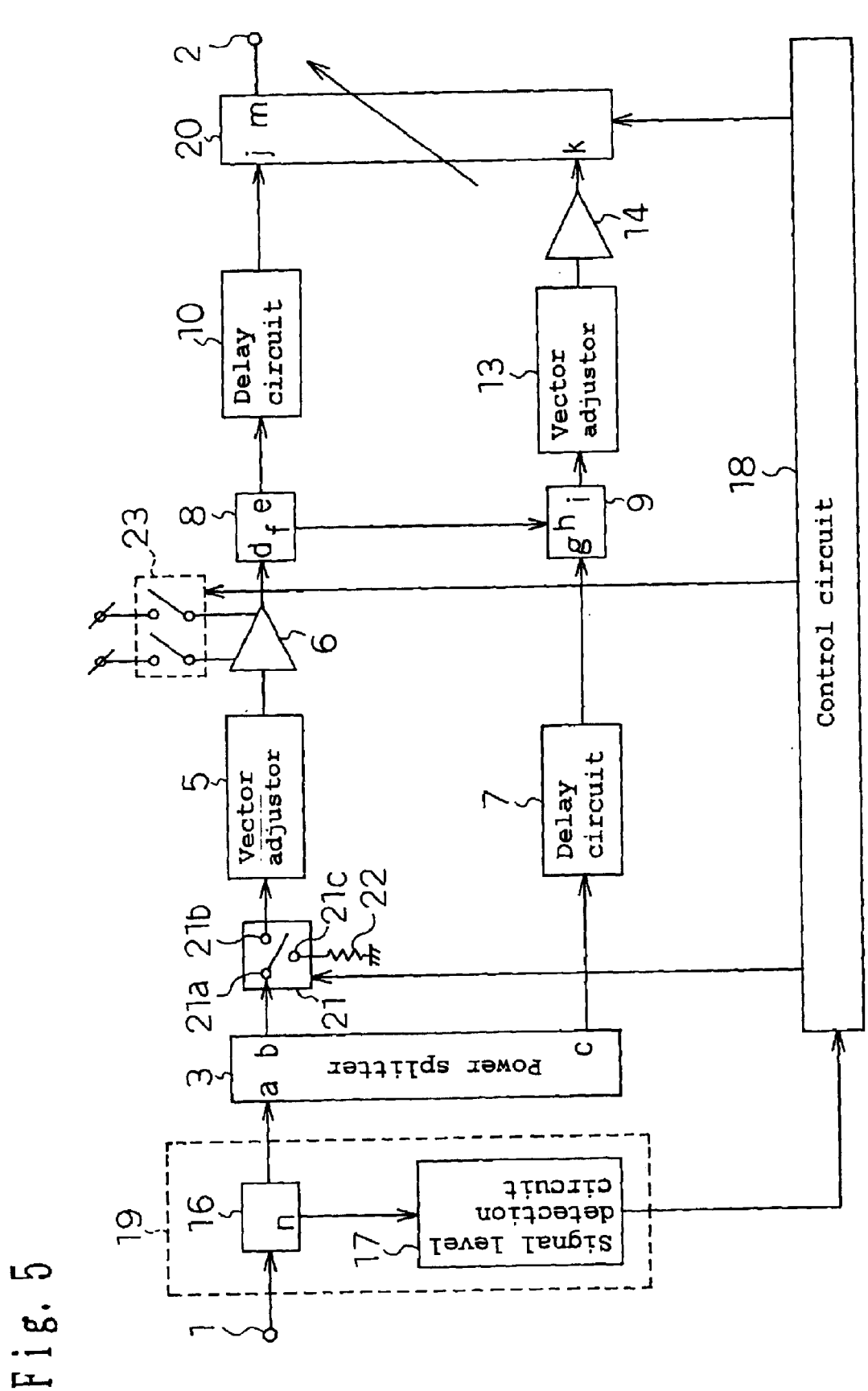
FIG. 5 shows a configuration diagram of the feedforward amplifier according to the embodiment 3 of the invention.

FIG. 5 shows a configuration diagram of the feedforward amplifier according to the embodiment 3 of the invention. In FIG. 5, reference numeral 20 denotes a variable power-combiner. The control circuit switches the switch circuit 21 and the main amplifier power-switch-circuit 23 and also adjusts the coupling amount of the variable power-combiner 20, depending on the signal level detected by the signal level detection circuit 17.

By the way, the power splitter 3 of the present embodiment is an example of the first power splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 13 an example of the second vector adjustor, the variable power-combiner 20 an example of the distortion suppression power-combiner, the control circuit 18 an example of the control means, the signal level detection portion 19 an example of the first signal level detection means, respectively.

With the feedforward amplifier configured as described above, hereinafter, its operation will be described with reference to the drawing.

The embodiment 3 according to invention provides the feedforward amplifier in which, when the output power reduces considerably lower than the nominal output power, the error amplifier 14 directly amplifies input signals for outputting. When an input signal level detected by the signal level detection circuit 17 is not lower than P2 (dBm), the control circuit 18 connects the common terminal 21*a* to the output switching terminal 21*b* of the switch circuit 21 and further turns on the main amplifier power-switch-circuit 23. At this time, the feedforward amplifier according to the embodiment 3 of the invention performs the same operation as conventional feedforward amplifiers.

On the other hand, when the input signal level is not higher than P2 (dBm), the control circuit 18 connects the common terminal 21*a* to the output switching terminal 21*c* of the switch circuit 21 and turns off the main amplifier power-switch-circuit 23, and further changes the variable power-combiner 20 from a loose coupling state (e.g. 10 dB) into a tight coupling state (e.g. 3 dB). That is, when the variable power-combiner 20 is in the tight coupling state, the degree of coupling between the port m and port k is 3 db, and when it is in the loose coupling state, the degree of coupling between the port k and the port m is 10 db.

Then, an input signal input from the input terminal 1 and including a plurality of carrier frequency components is split into two parts by the power splitter 3 through the power splitter 16, and the two parts are respectively output from the port b and port c.

The signal output from the port b is absorbed by the terminating resistor 22. Further, the signal out put from the port c is amplified by the error amplifier 14 through the delay circuit 7, power-combiner 9, and vector adjustor 13. In this case, in the power-combiner 9, because no signal is input into the port h, the signal input into the port g is output as-is from the port i.

The signal amplified by the error amplifier 14 is output from the output terminal 2 through the variable power-combiner 20. At this time, in the variable power-combiner 20, because no signal is input into the port j, the signal input into the port k is output as-is from the port m. That is, the output signal of the error amplifier 14 is output as-is from the output terminal 2. Further, because the variable power-combiner 20 is put in a tight coupling state, the signal input into the port k is output from the port m with less attenuation than in a loose coupling state.

Usually, the feedforward amplifiers amplifies input signals by the main amplifier 6, and detects and suppresses distortion components caused by the main amplifier 6 for outputting from the output terminal 2. However, when the feedforward amplifiers amplifies input signals directly by the error amplifier 14, if the level of distortions included in the output signals of the error amplifier 14 is not higher than D1 (e.g. −60 dBc) (wherein the input signal level corresponds to P2 (dBm)), it is no problem to directly output the as-is output signal of the error amplifier 14 to the output terminal 2. At this time, because the main amplifier power-switch-circuit 23 is turned off, the power consumed by the main amplifier 6 becomes zero, thus improving the efficiency at low output power.

Further, when the feedforward amplifier according to the embodiment 3 is used for a mobile communication equipment, even if the main amplifier 6 fails, the direct amplification by the error amplifier 14 allows the device to continue operating its function though with reduced maximum output power, thereby achieving the improved reliability of the whole mobile communication equipment.

By the way, although the above embodiment 3 is described for the case where the switching of the switch circuit 21 and the main amplifier power-switch-circuit 23 and the adjusting of the variable power-combiner 20 are performed depending on the input signal level, it is apparent that the same operation can be achieved by performing the switching depending on the level of signals output from the port b of the power splitter 3, the port c of the power splitter 3, or the delay circuit 7. In this case, the signal level detection portion 19 should be inserted into the position for the signal level to be detected.

(Embodiment 4)

Figure 6:
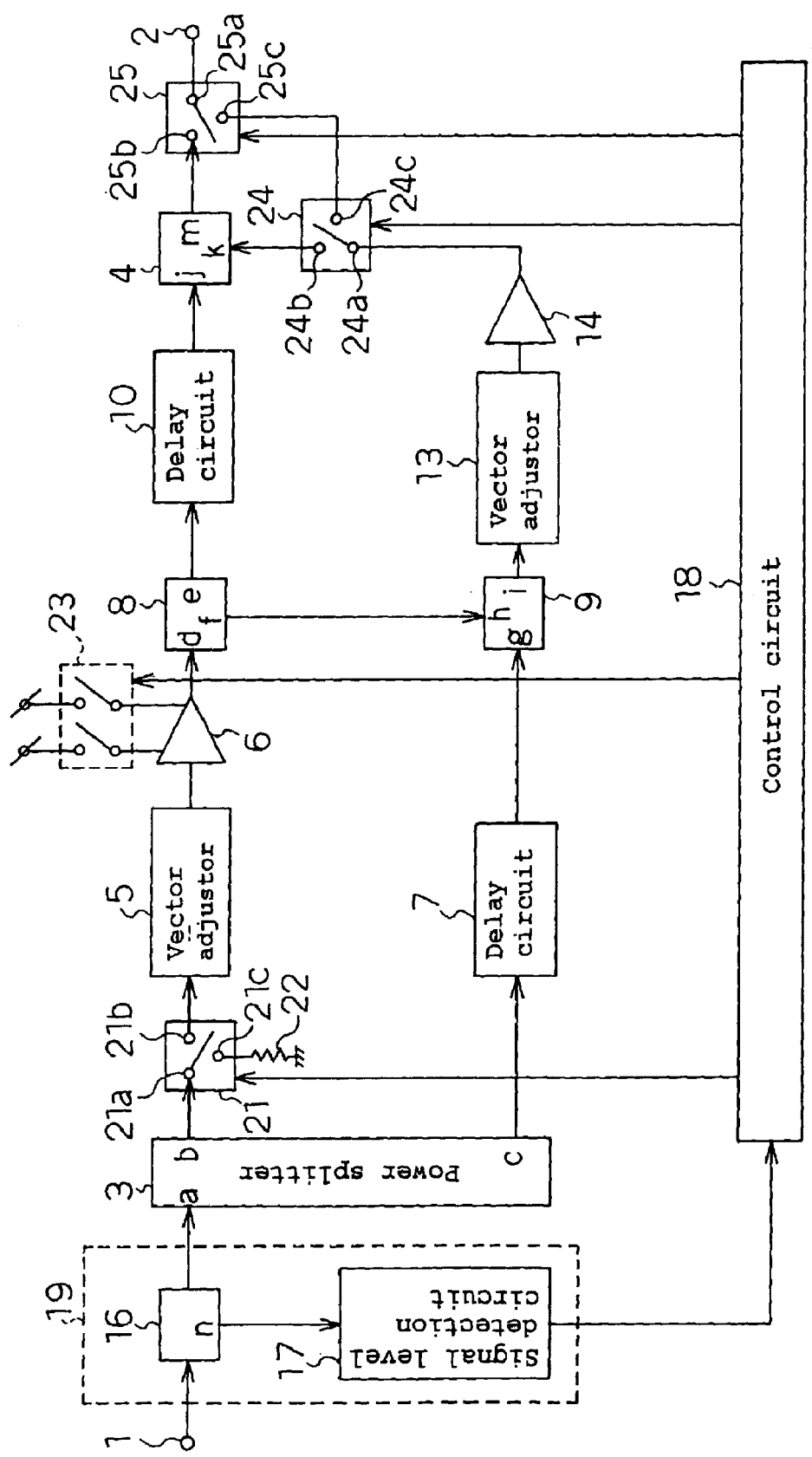
FIG. 6 shows a configuration diagram of the feedforward amplifier according to the embodiment 4 of the invention.

FIG. 6 shows a configuration diagram of the feedforward amplifier according to the embodiment 4 of the invention. In FIG. 6, reference numerals 24 and 25 denote a switch circuit. The control circuit 18 switches the switch circuits 21, 24 and 25 and the main amplifier power-switch-circuit 23 depending on the signal level detected by the signal level detection circuit 17.

By the way, the power splitter 3 of the present embodiment is an example of the first power splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 13 an example of the second vector adjustor, the power-combiner 4 an example of the distortion suppression power-combiner, the control circuit 18 an example of the control means, the signal level detection portion 19 an example of the first signal level detection means, respectively.

With the feedforward amplifier configured as described above, hereinafter, its operation will be described with reference to the drawing.

The embodiment 4 according to invention provides a feedforward amplifier in which, when the output power reduces considerably lower than the nominal output power, the error amplifier 14 directly amplifies input signals for outputting.

When an input signal level detected by the signal level detection circuit 17 is not lower than P2 (dBm), the control circuit 18 connects the common terminal 21a to the output switching terminal 21b of the switch circuit 21, a common terminal 24a to an output switching terminal 24b of the switch circuit 24, and a common terminal 25a to an output switching terminal 25b of the switch circuit 25, respectively, and further turns on the main amplifier power-switch-circuit 23. At this time, the feedforward amplifier according to the embodiment 4 of the invention performs the same operation as conventional feedforward amplifiers.

On the other hand, when the input signal level is not higher than P2 (dBm), the control circuit 18 connects the common terminal 21a to the output switching terminal 21c of the switch circuit 21, the common terminal 24a to an output switching terminal 24c of the switch circuit 24, and the common terminal 25a to an output switching terminal 25c of the switch circuit 25, respectively, and further turns off the main amplifier power-switch-circuit 23.

At this time, an input signal input from the input terminal 1 and including a plurality of carrier frequency components is split into two parts by the power splitter 3 through the power splitter 16, and the two parts are output from the port b and port c respectively.

The signal output from the port b is absorbed by the terminating resistor 22. Further, the signal output from the port c is amplified by the error amplifier 14 through the delay circuit 7, power-combiner 9, and vector adjustor 13. In this case, in the power-combiner 9, because no signal is input into the port h, the signal input into the port g is output as-is from the port i. The signal amplified by the error amplifier 14 is output from the output terminal 2 through the switch circuits 24 and 25. That is, the output signal of the error amplifier 14 is output as-is from the output terminal 2.

Usually, the feedforward amplifier amplifies input signals by the main amplifier 6, and detects and suppresses distortion components caused by the main amplifier 6 for outputting from the output terminal 2. However, when the feedforward amplifier amplifies input signals by the error amplifier 14 directly, if the level of distortions included in the output signals of the error amplifier 14 is not higher than D1 (e.g. −60 dBc) (wherein the input signal level corresponds to P2 (dBm), it is no problem to output the as-is output signal of the error amplifier 14 to the output terminal 2. At this time, because the main amplifier power-switch-circuit 23 is turned off, the power consumed by the main amplifier 6 becomes zero, allowing the improved efficiency at low output power. Further, when the feedforward amplifier according to the embodiment 4 is used for a mobile communication equipment, even if the main amplifier 6 fails, the direct amplification by the error amplifier 14 allows the device to continue operating its function though with reduced maximum output power, thereby allowing the improved reliability of the whole mobile communication equipment.

By the way, although the above embodiment 4 is described for the case where the switching of the switch circuits 21, 24 and 25 and the main amplifier power-switch-circuit 23 is performed depending on the input signal level, it is apparent that the same operation can be achieved by performing the switching depending on the level of signals output from the port b of the power splitter 3, the port c of the power splitter 3, or the delay circuit 7. In this case, the signal level detection portion 19 should be inserted into the position for the signal level to be detected.

(Embodiment 5)

Figure 7:
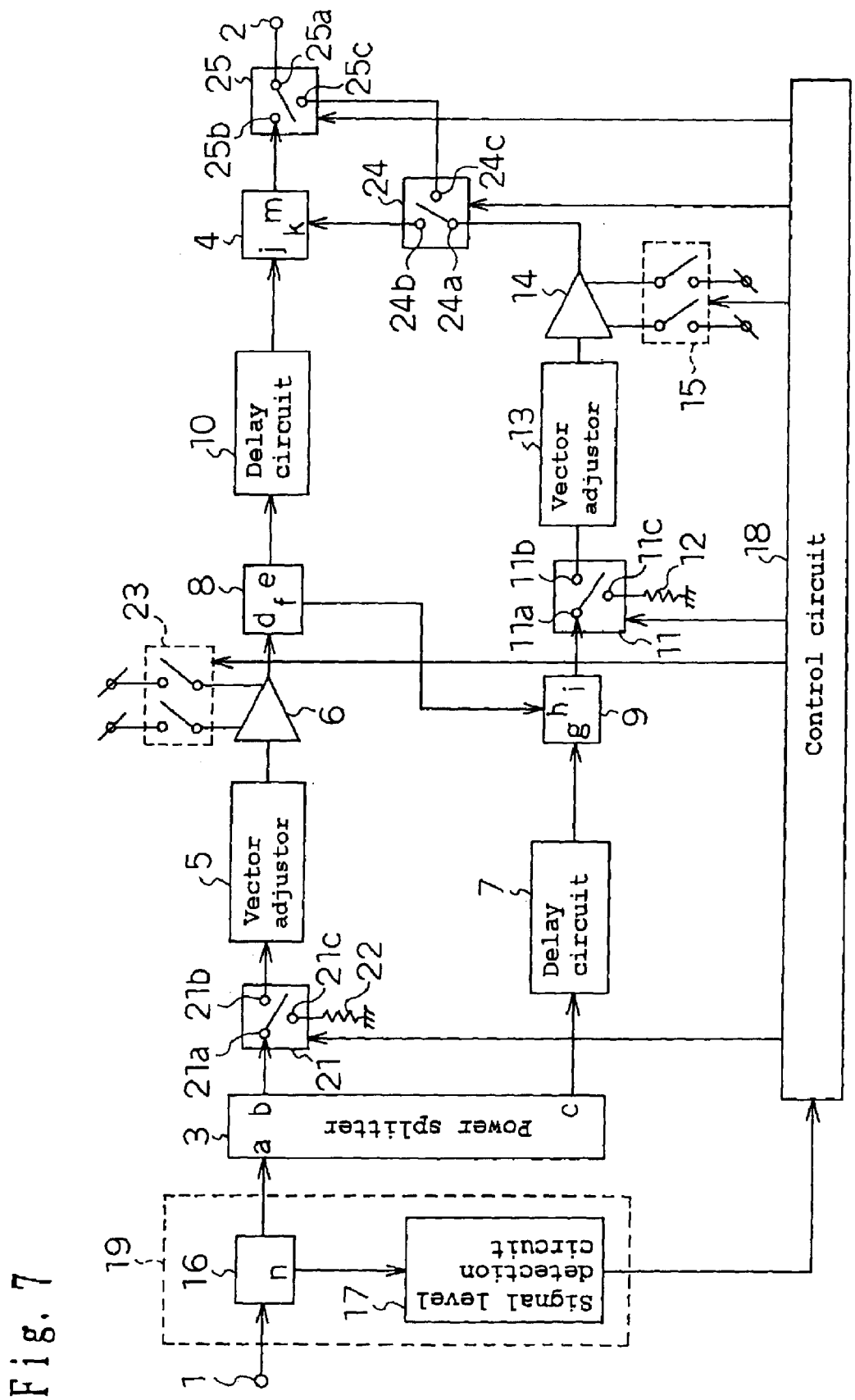
FIG. 7 shows a configuration diagram of the feedforward amplifier according to embodiment 5 of the invention.

FIG. 7 shows a configuration diagram of the feedforward amplifier according to the embodiment 5 of the invention, of which operation will be described with reference to the drawing hereinafter.

The embodiment 5 according to the invention has a configuration combining the embodiments 1 and the embodiment 4.

By the way, the power splitter 3 of the present embodiment is an example of the first power splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 13 an example of the second vector adjustor, the power-combiner 4 an example of the distortion suppression power-combiner, the control circuit 18 an example of the control means, the signal level detection portion 19 an example of the first signal level detection means, respectively.

When the level of an input signal input from the input terminal 1, detected by the signal level detection circuit 17, is not lower than P1 (dBm), the control circuit 18 connects the common terminal 11a to the output switching terminal 11b of the switch circuit 11, the common terminal 21a to the output switching terminal 21b of the switch circuit 21, the common terminal 24a to the output switching terminal 24b of the switch circuit 24, and the common terminal 25a to the output switching terminal 25b of the switch circuit 25, respectively, and further turns on the main amplifier power-switch-circuit 23 and the error amplifier power switch circuit 15. In this case, the feedforward amplifier according to the embodiment 5 of the invention performs the same operation as conventional feedforward amplifiers.

On the other hand, when the input signal level is not lower than P2 (dBm) and not higher than P1 (dBm), the control circuit 18 connects the common terminal 11a to the output switching terminal 11c of the switch circuit 11, the common terminal 21a to the output switching terminal 21b of the switch circuit 21, and the common terminal 25a to the output switching terminal 25b of the switch circuit 25, respectively, and further turns on the main amplifier power-switch-circuit 23 and turns off the error amplifier power switch circuit 15. For the switch circuit 24, the common terminal 24a may be connected to any one of the output switching terminals 24b and 24c. In this case, because the level of distortions included in the output signal of the main amplifier 6 is D1 (e.g. −60 dBc), the output signal of the main amplifier 6 is output as-is from the output terminal 2.

Further, when the input signal level is not higher than P2 (dBm), the control circuit 18 connects the common terminal 11a to the output switching terminal 11b of the switch circuit 11, the common terminal 21a to the output switching terminal 21c of the switch circuit 21, the common terminal 24a to the output switching terminal 24c of the switch circuit 24, and the common terminal 25a to the output switching terminal 25c of the switch circuit 25, respectively, and further turns on the error amplifier power switch circuit 15 and turns off the main amplifier power-switch-circuit 23. In this case, because the input signal is directly amplified by the error amplifier 14 and the level of distortions included in the output signal of the error amplifier 14 is not higher than D1 (e.g. −60 dBc), the output signal of the error amplifier 14 is output as-is from the output terminal 2.

Such a configuration of FIG. 7 can improve the efficiency at low output power. Further, when the feedforward amplifier according to the embodiment 5 is used for a mobile communication equipment, even if the main amplifier 6 fails, the direct amplification by the error amplifier 14 allows the device to continue operating its function though with reduced maximum output power, thereby allowing the improved reliability of the whole mobile communication equipment.

By the way, although the above embodiment 5 is described for the case where the switching of the switch circuits 11, 21, 24, and 25, the main amplifier power-switch-circuit 23 and the error amplifier power switch circuit 15 is performed depending on the input signal level, it is apparent that the same operation can be achieved by performing the switching depending on the level of signals output from the port b of the power splitter 3, the port c of the power splitter 3, or the delay circuit 7. In this case the signal level detection portion 19 should be inserted into the position for the signal level to be detected.

(Embodiment 6)

Figure 8:
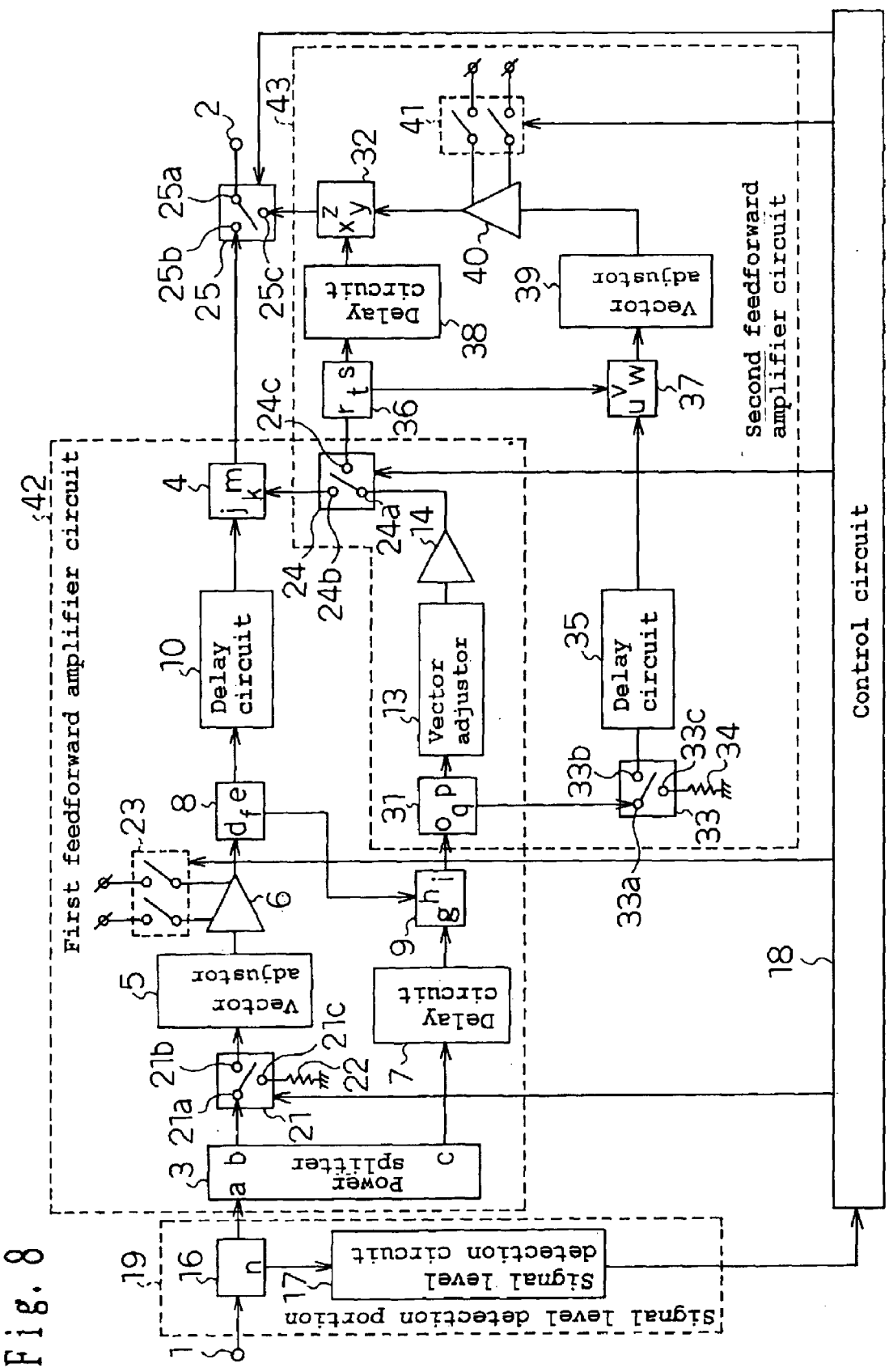
FIG. 8 shows a configuration diagram of the feedforward amplifier according to the embodiment 6 of the invention.

FIG. 8 shows a configuration diagram of the feedforward amplifier according to the embodiment 6 of the invention. In FIG. 8, reference numerals 31 and 36 denote power splitters, 32 and 37 power-combiners, 33 a switch circuit, 34 a terminating resistor, 35 and 38 delay circuits, 39 a vector adjustor, 40 a power amplifier, 41 a power amplifier power switch circuit, respectively. The power splitters 3, 8, and 31, the power-combiners 4 and 9, the vector adjustors 5 and 13, the main amplifier 6, the delay circuits 7 and 10, the error amplifier 14, the switch circuits 21 and 24, the main amplifier power-switch-circuit 23 and the terminating resistor 22 constitute a first feedforward amplifier circuit 42. Further, the power splitters 31 and 36, the power-combiners 32 and 37, the vector adjustors 13 and 39, the error amplifier 14, the delay circuits 35 and 38, the power amplifier 40, the switch circuits 24 and 33, the power amplifier power switch circuit 41, and the terminating resistor 34 constitute a second feedforward amplifier circuit 43. Further, the symbols o to z added to the power splitters 31 and 36 and the power-combiners 32 and 37 denotes each port.

By the way, the power splitter 3 of the present embodiment is an example of the first splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 13 an example of the second vector adjustor, the power-combiner 4 an example of the distortion suppression power-combiner, the control circuit 18 an example of the control means, the signal level detection portion 19 an example of the first signal level detection means, the power splitter 36 an example of the third power splitter, the delay circuit 38 an example of the third delay circuit, the power splitter 31 an example of the fourth power splitter, the delay circuit 35 an example of the fourth delay circuit, the power-combiner 37 an example of the second distortion detection power-combiner, the vector adjustor 39 an example of the third vector adjustor, the power amplifier 40 an example of the second error amplifier, and the power-combiner 32 an example of the second distortion suppression power-combiner, respectively.

With the feedforward amplifier configured as described above, its operation will be described with reference to the drawing hereinafter.

An input signal input from an input terminal 1 and including a plurality of carrier frequency components is input into the port a of the power splitter 3 through the power splitter 16. At this time, part of the input signal is took out from the port n of the power splitter 16 and input into the signal level detection circuit 17. The signal input into the port a of the power splitter 3 is split into two parts, which are output from the port b and port c respectively.

The signal output from the port b is input into the common terminal 21a of the switch circuit 21.

Here, when the input signal level detected by the signal level detection circuit 17 is not lower than P3 (dBm), the control circuit 18 connects the common terminal 21a to the output switching terminal 21b of the switch circuit 21, the common terminal 24a to the output switching terminal 24b of the switch circuit 24, the common terminal 25a to the output switching terminal 25b of the switch circuit 25, and the common terminal 33a to the output switching terminal 33c of the switch circuit 33, respectively, and further turns on the main amplifier power-switch-circuit 23 and turns off the power amplifier power switch circuit 41.

On the other hand, when the input signal level is not higher than P3 (dBm), the control circuit 18 connects the common terminal 21a to the output switching terminal 21c of the switch circuit 21, the common terminal 24a to the output switching terminal 24c of the switch circuit 24, the common terminal 25a to the output switching terminal 25c of the switch circuit 25, and the common terminal 33a to the output switching terminal 33b of the switch circuit 33, respectively, and turns on the power amplifier power switch circuit 41 and further turns off the main amplifier power-switch-circuit 23.

First, when the input signal level is not lower than P3 (dBm), the signal input into the common terminal 21a of the switch circuit 21 is amplified by the main amplifier 6 through the output switching terminal 21b and the vector adjustor 5, and input into the port j of the power-combiner 4 through the power splitter 8 and the delay circuit 10. At this time, signals including distortion components caused by intermodulation due to the non-linearity of the main amplifier 6 in addition to the carrier frequency components are input into the port j. Further, part of the output signal of the main amplifier 6 is took out from the port f of the power splitter 8, and input into the port h of the power-combiner 9.

On the other hand, the signal output from the port c is input into the port g of the power-combiner 9 through the delay circuit 7. Here, the vector adjustor 5 and the delay circuit 7 are adjusted such that the carrier frequency components of the signals input into the port g and the port h may have the same amplitudes and opposite phases, by which a signal having only the distortion components with the carrier frequency components canceled out is output from the port i.

Next, the signal output from the port i is split into two parts by the power splitter 31 and the two parts are output from a port p and port q respectively. The signal out put from the port q is absorbed by the terminating resistor 34 through the switch circuit 33. The signal output from the port p is amplified by the error amplifier 14 through the vector adjustor 13, and input into the port k of the power splitter 4 through the switch circuit 24. Here, the vector adjustor 13 and the delay circuit 10 are adjusted such that the distortion components of the signals input into the port j and the port k may have the same amplitudes and opposite phases, thereby a signal having only the carrier frequency components with the distortion components canceled out being output from the port m of the power-combiner 4. The signal output from the port m is output from the output terminal 2 through the switch circuit 25.

On the other hand, when the input signal level is not higher than P3 (dBm), the signal input into the common terminal 21a of the switch circuit 21 is absorbed by the terminating resistor 22 through the output switching terminal 21c. Further, the signal output from the port c is input into a port o of the power splitter 31 through the delay circuit 7 and the power-combiner 9. At this time, in the power-combiner 9, because no signal is input into the port h, the signal input into the port g is output as-is from the port i. The signal input into the port o of the power splitter 31 is split into two parts, which are output from the port p and port q respectively. The signal output from the port p is amplified by the error amplifier 14 through the vector adjustor 13, and input into a port x of the power-combiner 32 through the switch circuit 24, power splitter 36 and delay circuit 38.

At this time, signals including distortion components caused by intermodulation due to the non-linearity of the error amplifier 14 in addition to the carrier frequency components are input into the port x. Further, part of the output signal of the switch circuit 24 is took out from a port t of the power splitter 36, and input into a port v of the power-combiner 37. On the other hand, the signal output from the port q is input into a port u of the power-combiner 37 through the switch circuit 33 and the delay circuit 35.

Here, the vector adjustor 13 and the delay circuit 35 are adjusted such that the carrier frequency components of the signals input into the port u and the port v may have the same amplitudes and opposite phases. Thereby, a signal having only the distortion components with the carrier frequency components canceled out is output from a port w.

Then, the signal output from the port w is amplified by the power amplifier 40 through the vector adjustor 39 and input into a port y of the power-combiner 32. Here, the vector adjustor 39 and the delay circuit 38 are adjusted such that the distortion components of the signals input into the port x and the port y may have the same amplitudes and opposite phases. Thereby, a signal having only the carrier frequency components with the distortion components canceled out is output from a port z of the power-combiner 32. The signal output from the port z is output from the output terminal 2 through the switch circuit 25.

That is, when the input signal level is not lower than P3 (dBm), the first feedforward amplifier circuit 42 amplifies the input signal, and when the input signal level is not higher than P3 (dBm), the second feedforward amplifier circuit 43 amplifies the input signal. The power consumed by the power amplifier 40 is much less than that by the main amplifier 6. Further, because the error amplifier 14 is made for lower power when compared to the main amplifier 6, the power consumed by the error amplifier 14 is less than that by the main amplifier.

Such a configuration of FIG. 8 can improve the efficiency, since, at low output power, the power consumed by the main amplifier becomes zero while the power consumed by the power amplifier 40 increases. Further, when the feedforward amplifier according to the embodiment 6 is used for a mobile communication equipment, even if the main amplifier 6 fails, the device can continue operating its function though with reduced maximum output power, thereby allowing the improved reliability of the whole mobile communication equipment.

By the way, although the above embodiment 6 is described for the case where the switching of the switch circuits 21, 24, 25 and 33, the main amplifier power-switch-circuit 23 and the power amplifier power switch circuit 41 are performed depending on the input signal level, it is apparent that the same operation can be achieved by performing the switching depending on the level of signals output from the port b of the power splitter 3, the port c of the power splitter 3, or the delay circuit 7. In this case, the signal level detection portion 19 should be inserted into the position for the signal level to be detected.

(Embodiment 7)

Figure 9:
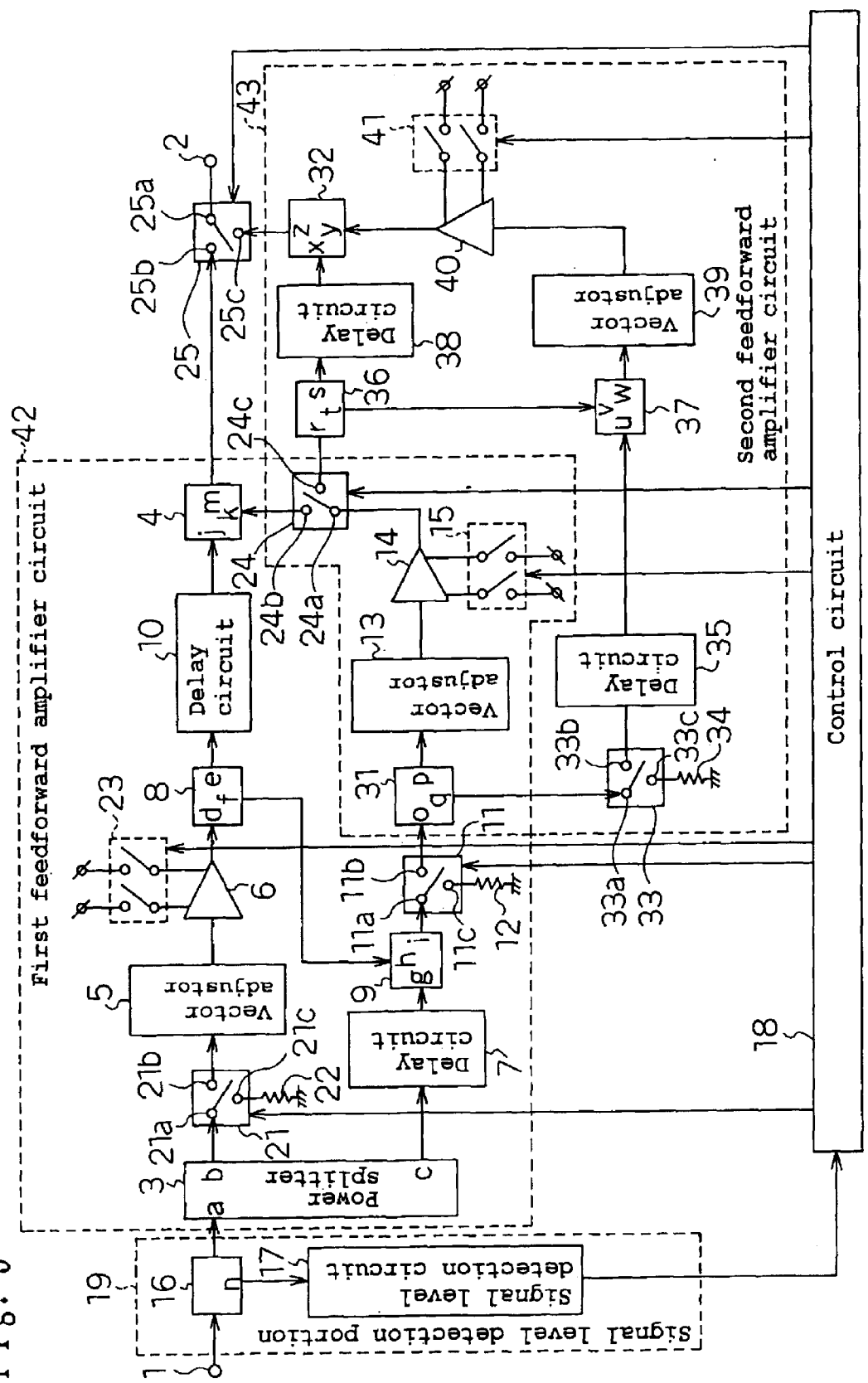
FIG. 9 shows a configuration diagram of the feedforward amplifier according to the embodiment 7 of the invention.

FIG. 9 shows a configuration diagram of the feedforward amplifier according to the embodiment 7 of the invention, of which operation will be described with reference to the drawing hereinafter.

The embodiment 7 according to the invention has a configuration combining the embodiments 1 and the embodiment 6.

By the way, the power splitter 3 of the present embodiment is an example of the first power splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 3 an example of the second vector adjustor, the power-combiner 4 an example of the distortion suppression power-combiner, the control circuit 18 an example of the control means, the signal level detection portion 19 an example of the first signal level detection means, the power splitter 36 an example of the third power splitter, the delay circuit 38 an example of the third delay circuit, the power splitter 31 an example of the fourth power splitter, the delay circuit 35 an example of the fourth delay circuit, the power-combiner 37 an example of the second distortion detection power-combiner, the vector adjustor 39 an example of the third vector adjustor, the power amplifier 40 an example of the second error amplifier, and the power-combiner 32 an example of the second distortion suppression power-combiner, respectively.

When the level of an input signal input from the input terminal 1, detected by the signal level detection circuit 17, is not lower than P3 (dBm) the control circuit 18 connects the common terminal 11a to the output switching terminal 11b of the switch circuit 11, the common terminal 21a to the output switching terminal 21b of the switch circuit 21, the common terminal 24a to the output switching terminal 24b of the switch circuit 24, the common terminal 25a to the output switching terminal 25b of the switch circuit 25, and the common terminal 33a to the output switching terminal 33c of the switch circuit 33, respectively, and further turns on the main amplifier power-switch-circuit 23 and the error amplifier power switch circuit 15 and turns off the power amplifier power switch circuit 41. In this case, the input signal is amplified by the first feedforward amplifier circuit 42 and output from the output terminal 2.

On the other hand, when the input signal level is not lower than P1 (dBm) and not higher than P3 (dBm), the control circuit 18 connects the common terminal 11a to the output switching terminal 11b of the switch circuit 11, the common terminal 21a to the output switching terminal 21c of the switch circuit 21, the common terminal 24a to the output switching terminal 24c of the switch circuit 24, the common terminal 25a to the output switching terminal 25c of the switch circuit 25, and the common terminal 33a to the output switching terminal 33b of the switch circuit 33, respectively, and further turns on the error amplifier power switch circuit 15 and the power amplifier power switch circuit 41 and turns off the main amplifier power-switch-circuit 23. In this case, the input signal is amplified by the second feedforward amplifier circuit 43 and output from the output terminal 2.

Further, when the input signal level is not higher than P1 (dBm) the control circuit 18 connects the common terminal 11a to the output switching terminal 11c of the switch circuit 11, the common terminal 21a to the output switching terminal 21b of the switch circuit 21, the common terminal 25a to the output switching terminal 25b of the switch circuit 25, and the common terminal 33a to the output switching terminal 33c of the switch circuit 33, respectively, and further turns on the main amplifier power-switch-circuit 23 and turns off the error amplifier power switch circuit 15 and the power amplifier power switch circuit 41. For the switch circuit 24, the common terminal 24a may be connected to any one of the output switching terminals 24b and 24c. In this case, because the level of distortions included in the output signal of the main amplifier 6 is not higher than D1 (e.g. −60 dBc), the output signal of the main amplifier 6 is output as-is from the output terminal 2.

Such a configuration of FIG. 9 can improve the efficiency at low output power. Further, when the feedforward amplifier according to the embodiment 7 is used for a mobile communication equipment, even if the main amplifier 6 fails, the device can continue operating its function though with reduced maximum output power, thereby allowing the improved reliability of the whole mobile communication equipment.

By the way, although the above embodiment 7 is described for the case where the switching of the switch circuits 11, 21, 24, 25 and 33, the main amplifier power-switch-circuit 23, error amplifier power switch circuit 15, and the power amplifier power switch circuit 41 are performed depending on the input signal level, it is apparent that the same operation can be achieved by performing the switching depending on the level of signals output from the port b of the power splitter 3, the port c of the power splitter 3, or the delay circuit 7. In this case, the signal level detection portion 19 should be inserted into the position for the signal level to be detected.

(Embodiment 8)

Figure 10:
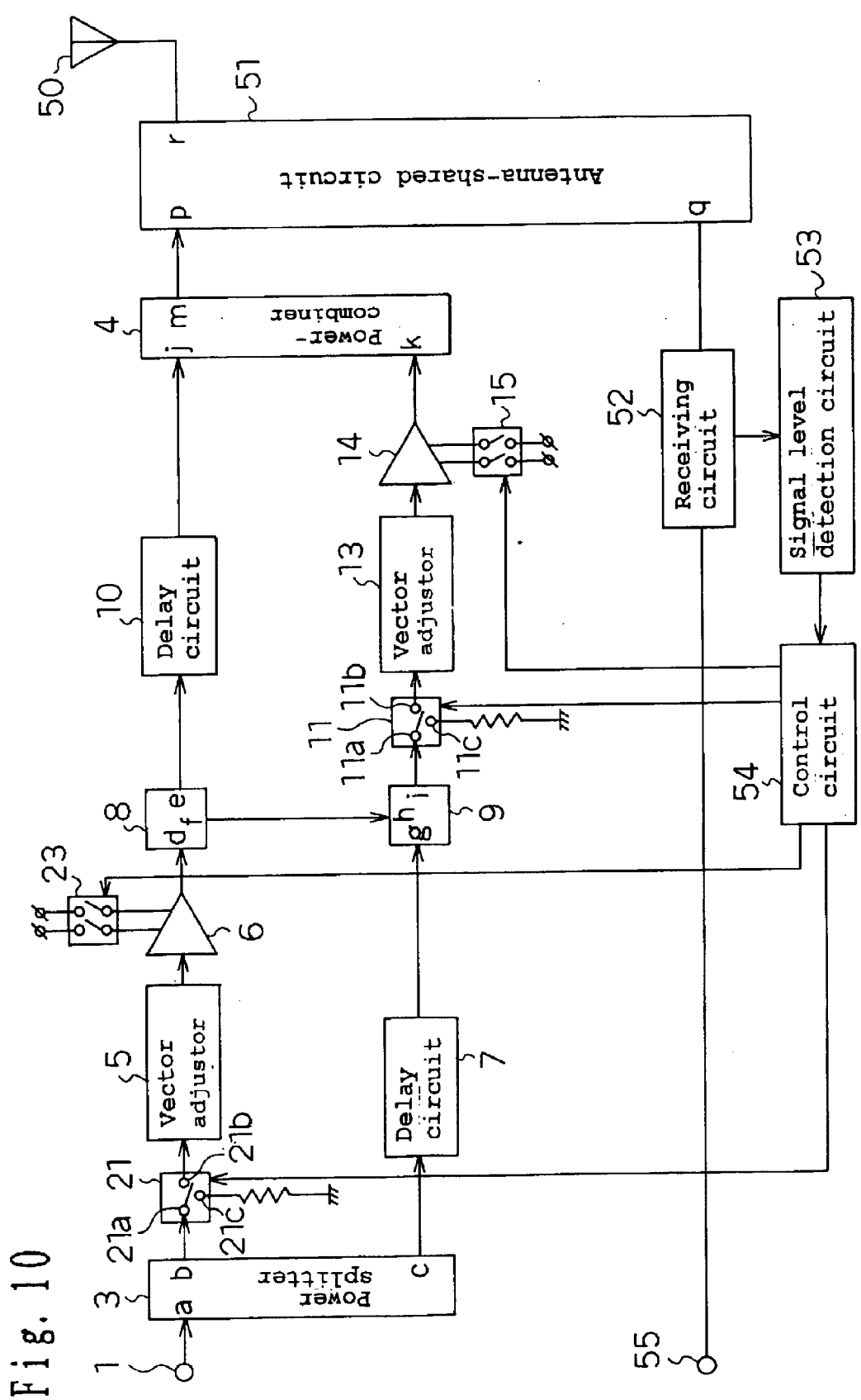
FIG. 10 shows a configuration diagram of the feedforward amplifier according to the embodiment 8 of the invention.

FIG. 10 shows a configuration diagram of the feedforward amplifier according to the embodiment 8 of the invention.

The same portions of the feedforward amplifier of the embodiment 8 as the feedforward amplifier of the embodiment 5 will be denoted by the same symbols as the embodiment 5 and the detailed description thereof will be omitted.

FIG. 10 of the embodiment 8 is different from FIG. 7 of the embodiment 5 in the following points.

That is, in the feedforward amplifier of FIG. 10, the port k of the power-combiner 4 is connected to the output of the error amplifier 14, and the port j of the power amplifier is connected to the output of the delay circuit 10. Further, a port p of an antenna-shared circuit 51 is connected to the port m of the power-combiner 4. Further, a port r of the antenna-shared circuit 51 is connected to an antenna 50 and a port q of the antenna-shared circuit 51 is connected to the input of the receiving circuit 52. The output of the receiving circuit 52 is connected to a received-signal output terminal 55. Further, a signal level detection circuit 53 is connected to the receiving circuit 52, and a control circuit 54 is connected to the output of the signal level detection circuit 53. The others are the same as the embodiment 5.

By the way, the power splitter 3 of the present embodiment is an example of the first power splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 13 an example of the second vector adjustor, the power-combiner 4 an example of the distortion suppression power-combiner, the control circuit 18 an example of the control means, the signal level detection circuit 53 an example of the first signal level detection means, respectively.

Next, the present embodiment as such will be described centering on the points different from the embodiment 5.

In the embodiment 5, the signal detection circuit 17 detects the input signal level of an input signal input from the input terminal 1, and the control circuit 18 controls the switch circuit 11 and the like based on the detected input signal level. On the other hand, in the present embodiment, the signal level detection circuit 53 detects the level of a received signal of an incoming wave received by the antenna 50. Also, the control circuit 54 controls the switch circuit 11 and the like based on the level of the received signal detected.

That is, the antenna-shared circuit 51 introduces the incoming wave received by the antenna 50 as a received signal into the receiving circuit 52, And also introduces a transmitting signal output from the port m of the power-combiner 4 to the antenna 50.

The receiving circuit 52 processes the received signal output from the port q of the antenna-shared circuit 51 for outputting to the received-signal output terminal 55, and also outputs the processed received-signal to the signal level detection circuit 53.

The signal level detection circuit 53 detects the received-signal level of the received signal output from the receiving circuit 52.

Generally, when the level of the received-signal received by the antenna 50 is low, the partner device is considered to exist at a distant place or at a place from which radio wave is difficult to reach the antenna. Therefore, it is necessary to transmit a transmitting wave of high power from the antenna 50 such that the partner device may receive satisfactorily the transmitting wave. Alternatively, when the received-signal level of the received-signal received by the antenna 50 is high, the partner device is considered to exist at a near place or at a place from which radio wave is easy to reach the antenna. Therefore, transmission of a transmitting wave of low power to the partner device still allows the partner device to receive satisfactorily the transmitting wave.

Therefore, when the level of received signals output from the receiving circuit 52 and detected by the signal level detection circuit 53 is not higher than P2 (dBm), the control circuit 54 connects the common terminal 11a to the output switching terminal 11b of the switch circuit 11 and the common terminal 21a to the output switching terminal 21b of the switch circuit 21, respectively, and further turns on the main amplifier power-switch-circuit 23 and the error amplifier power switch circuit 15. In this case, the feedforward amplifier according to the present embodiment operates in the same manner as conventional feedforward amplifiers.

On the other hand, when the level of received-signals output from the receiving circuit 52 and detected by the signal level detection circuit 53 is not lower than P2 (dBm) and not higher than P1 (dBm), the control circuit 54 connects the common terminal 11a to the output switching terminal 11c of the switch circuit 11 and the common terminal 21a to the output switching terminal 21c of the switch circuit 21, respectively, and further turns on the main amplifier power-switch-circuit 23 and turns off the error amplifier power switch circuit 15. In this case, because the level of distortions included in the output signal of the main amplifier 6 is not higher than D1 (e.g. −60 dBc), the output signal of the main amplifier 6 is output as-is from the port m of the power-combiner 4.

Further, when the input signal level is not lower than P1 (dBm), the control circuit 54 connects the common terminal 11a to the output switching terminal 11b of the switch circuit 11 and the common terminal 21a to the output switching terminal 21c of the switch circuit 21, respectively, and further turns on the error amplifier power switch circuit 15 and turns off the main amplifier power-switch-circuit 23. In this case, because the input signal is amplified directly by the error amplifier 14 and the level of distortions included in the output signal of the error amplifier 14 is not higher than D1 (e.g. −60 dBc), the output signal of the error amplifier 14 is output as-is from the port m of the power-combiner 4.

Therefore, the configuration of FIG. 10 can improve the efficiency at low output power. Further, when the feedforward amplifier according to the embodiment 8 is used for a mobile communication equipment, even if the main amplifier 6 fails, the direct amplification by the error amplifier 14 allows the device to continue operating its function though with reduced maximum output power, thereby allowing the improved reliability of the whole mobile communication equipment.

By the way, although the above embodiment 8 performs the switching of the switch circuits 11 and 21, the main amplifier power-switch-circuit 23, and the error amplifier power switch circuit 15 depending on the level of the received signal processed by the receiving circuit 52, it is apparent that the same operation can be achieved by performing the switching depending on the level of the received signal before being processed by the receiving circuit 52 or the level of the received signal in the course of being processed by the receiving circuit 52.

By the way, with each of the feedforward amplifiers described referring to FIGS. 1, 4, 5, 6, 7, 8, and 9, instead of detecting the signal level of input signals by the signal level detection circuit 17, the signal level detection circuit 52 may be used to detect the signal level of received signals from the receiving circuit 52 in the same manner as the embodiment 8, and then the control circuit may control each switch circuit and the like based on the detected signal level.

However, when the signal level of received signals from the receiving circuit 52 is detected and the control circuit controls each switch circuit and the like based on the detected signal level, the amplitude of the detected signal level is inverse to that in the case where the controlling is performed in the feedforward amplifiers described in each of the embodiments.

For example, in the feedforward amplifier of FIG. 1 described in association with the embodiment 1, when the detected signal level of the received signal from the receiving circuit 52 is not higher than P1 (dBm), the control circuit 18 should connect the common terminal 11a to the output switching terminal 11b of the switch circuit 11, and also turn on the error amplifier power switch circuit 15. On the other hand, when the input signal level is higher than P1 (dBm), the control circuit 18 should connect the common terminal 11a to the output switching terminal 11c of the switch circuit 11, and also turn off the error amplifier power switch circuit 15.

When the signal level of received signals from the receiving circuit 52 is detected and the control circuit controls each switch circuit and the like based on the detected signal level in the above manner, the controlling should be performed such that the amplitude of the detected signal level may be inverse to that in the case where the controlling is performed by the feedforward amplifiers described in each of the embodiments. The others are the same as each of the embodiments.
(Embodiment 9)

Figure 11:
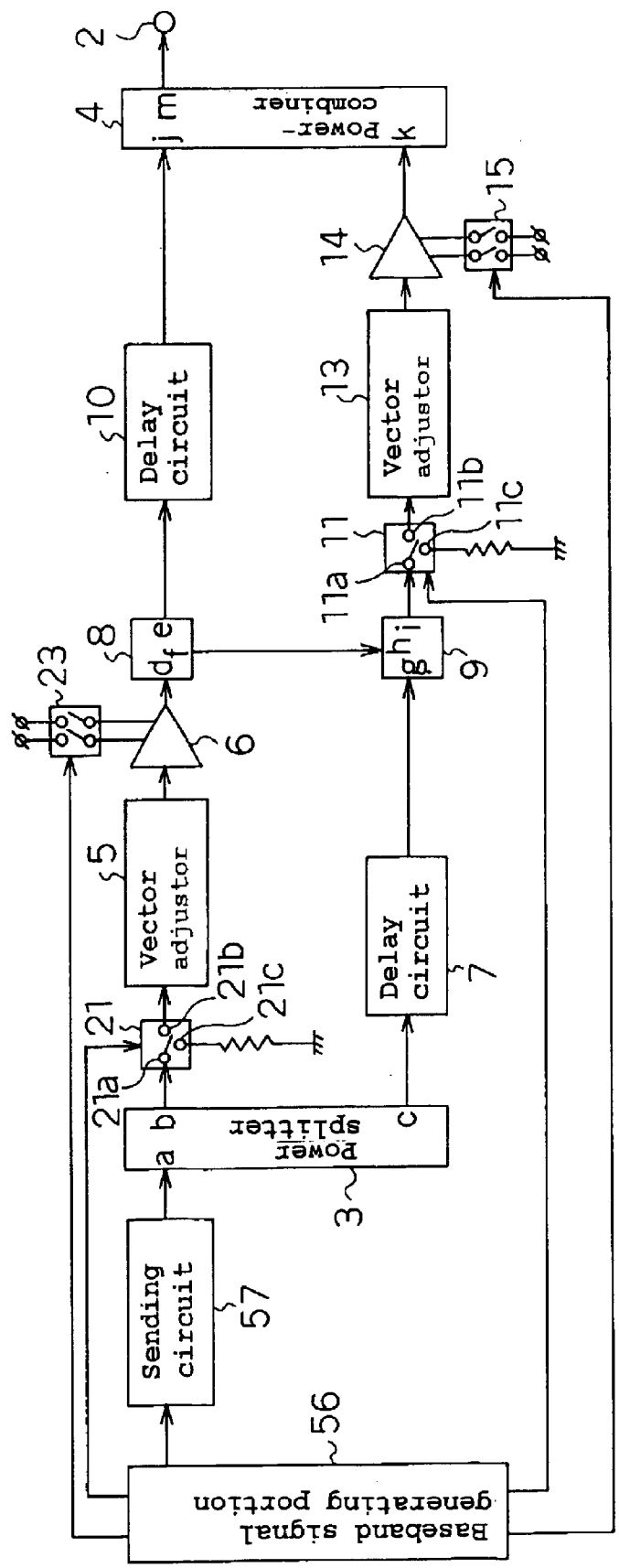
FIG. 11 shows a configuration diagram of the feedforward amplifier according to the embodiment 9 of the invention.

FIG. 11 shows a configuration diagram of the feedforward amplifier according to the embodiment 9 of the invention.

The same portions of the feedforward amplifier of the embodiment 9 as the feedforward amplifier of the embodiment 5 will be denoted by the same symbols as the embodiment 5 and the detailed description thereof will be omitted.

FIG. 11 of the embodiment 9 is different from FIG. 7 of the embodiment 5 in the following points.

That is, a baseband signal generating portion 56 performs both functions of the signal level detection circuit and the control circuit of the embodiment 7. Further, the baseband signal generating portion 56 is connected to a transmitting circuit 57, which is connected to the port a of the power splitter 3.

By the way, the power splitter 3 of the present embodiment is an example of the first power splitter of the invention, the vector adjustor 5 an example of the first vector adjustor, the power splitter 8 an example of the second power splitter, the delay circuit 7 an example of the first delay circuit, the power-combiner 9 an example of the distortion detection power-combiner, the delay circuit 10 an example of the second delay circuit, the vector adjustor 13 an example of the second vector adjustor, the power-combiner 4 an example of the distortion suppression power-combiner, the baseband signal generating portion 56 an example of the control means, respectively, and the baseband signal generating portion 56 also serves as an example of the first signal level detection means.

Next, the present embodiment as such will be described centering on the points different from the embodiment 5.

The baseband signal generating portion 56 generates a baseband signal from signals input from a microphone and the like not shown, and outputs the baseband signal to a transmitting circuit 57. The transmitting circuit 57 modulates the baseband signal incoming from the baseband signal generating portion 56, converting the baseband signal into a modulated signal and a transmitting frequency which are output to the port a of the power splitter.

Further, the baseband signal generating portion 56 detects the signal level of the baseband signal.

Then, when the signal level of baseband signals detected by the baseband signal generating portion 56 is not lower than P1 (dBm), the baseband signal generating portion 56 connects the common terminal 11a to the output switching terminal 11b of the switch circuit 11 and the common terminal 21a to the output switching terminal 21b of the switch circuit 21, respectively, and further turns on the main amplifier power-switch-circuit 23 and the error amplifier power switch circuit 15. In this case, the feedforward amplifier according to the embodiment 9 operates in the same manner as conventional feedforward amplifiers.

On the other hand, when the signal level of baseband signals detected by the baseband signal generating portion 56 is not lower than P2 (dBm) and not higher than P1 (dBm), the baseband signal generating portion 56 connects the common terminal 11a to the output switching terminal 11c of the switch circuit 11 and the common terminal 21a to the output switching terminal 21b of the switch circuit 21, respectively, and further turns on the main amplifier power-switch-circuit 23 and turns off the error amplifier power switch circuit 15. In this case, because the level of distortions included in the output signal of the main amplifier 6 is not higher than D1 (e.g. −60 dBc), the output signal of the main amplifier 6 is output as-is from the output terminal 2.

Further, when the signal level of baseband signals detected by the baseband signal generating portion 56 is not higher than P2 (dBm), the baseband signal generating portion 56 connects the common terminal 11a to the output switching terminal 11b of the switch circuit 11 and the common terminal 21a to the output switching terminal 21c of the switch circuit 21, respectively, and further turns on the error amplifier power switch circuit 15 and turns off the main amplifier power-switch-circuit 23. In this case, because the input signal is directly amplified by the error amplifier 14 and the level of distortions included in the output signal of the error amplifier 14 is not higher than D1 (e.g. −60 dBc), the output signal of the error amplifier 14 is output as is from the output terminal 2.

Generally, when the level of baseband signals is high, the output signal of the output terminal 2 becomes of high power, and when the level of baseband signals is low, the output signal of the output terminal 2 becomes of low power.

Therefore, the configuration of FIG. 11 can improve the efficiency at low output power. Further, when the feedforward amplifier according to the embodiment 9 is used for a mobile communication equipment, even if the main amplifier 6 fails, the direct amplification by the error amplifier 14 allows the device to continue operating its function though with reduced maximum output power, thereby allowing the improved reliability of the whole mobile communication equipment.

By the way, although the above embodiment 9 performs the switching of the switch circuits 11 and 21, the main amplifier power-switch-circuit 23 and the error amplifier power switch circuit 15 depending on the signal level of baseband signals from the baseband signal generating portion 56, it is apparent that the same operation can be obtained by performing the switching depending on the signal level of input signals input from a microphone and the like into the baseband signal generating portion 56 or the signal level of baseband signals in the course of being processed by the baseband signal generating portion 56 or the signal level of baseband signals output from the baseband signal generating portion 56. Further, it is apparent that the same operation can be obtained by performing the switching depending on the signal level of signals in the course of being processed by the transmitting circuit 57 or the signal level of transmitting signals output from the transmitting circuit 57.

By the way, with each of the feedforward amplifiers described referring to FIGS. 1, 4, 5, 6, 7, 8, and 9, instead of detecting the signal level of input signals input from the input terminal 1 by the signal level detection circuit 17, the signal level of baseband signals may be detected in the same manner as the embodiment 9 and each switch circuit and the like may be controlled based on the detected signal level.

It has been described that the feedforward amplifier according to the embodiment 3 uses the variable power-combiner 20, and when it operates both the main amplifier 6 and error amplifier 13, the variable power-combiner 20 is in a loose coupling state and the main amplifier 6 is also stopped, and, when it operates the error amplifier 13 only, the variable power-combiner 20 is in a tight coupling state. However, the variable power-combiner 20 may be used for the feedforward amplifiers other than that of the embodiment 3 to perform the same operation. This can improve further the efficiency of the feedforward amplifier according to the present embodiment.

Further, with the feedforward amplifier according to the embodiment 4, it has been described that, at low output power, the switch circuits 24 and 25 are used to output signals without passing through the power-combiner 4. However, the same operation may be applied to the feedforward amplifiers other than that of the embodiment 4. This can improve further the efficiency of the feedforward amplifier according to the present embodiment.

Further, when an abnormal event occurs in the main amplifier, the error amplifier can be used to amplify and output the input signal, thereby allowing the improved reliability of mobile communication equipments using the feedforward amplifier.

Furthermore, communication equipments comprising a baseband signal generating portion for generating a baseband signal and a transmitting circuit for generating a transmitting signal from the baseband signal generated, in which the feedforward amplifiers according to the invention is used for the above described transmitting circuit is included in the invention.

Further, the communication equipments according to the invention refer to base station devices of mobile communication equipment such as portable telephones, PHS and car telephones.

As apparent from the above description, the invention can provide a feedforward amplifier and a mobile communication equipment of which efficiency does not reduce even at reduced output power.

Further, the invention can provide a feedforward amplifier and a mobile communication equipment of which communication does not stop completely even if the main amplifier fails.

What is claimed is:

1. A feedforward amplifier comprising:
   a first power splitter for splitting an input signal into two parts;
   a first vector adjustor for adjusting the amplitude and phase of one output signal of said first power splitter;
   a main amplifier for amplifying an output signal of said first vector adjustor;
   a second power splitter for splitting an output signal of said main amplifier into two parts;
   a first delay circuit for delaying the other output signal of said first power splitter;
   a distortion detection power-combiner for synthesizing one output signal of said second power splitter and an output signal of said first delay circuit;
   a second delay circuit for delaying the other output signal of said second power splitter;
   a second vector adjustor for adjusting the amplitude and phase of the output signal of said distortion detection power-combiner;
   an error amplifier for amplifying the output signal of said second vector adjustor;
   a distortion suppression power-combiner for synthesizing the output signal of said second delay circuit and the output signal of said error amplifier;
   control means of at least stopping the operation of said error amplifier or said main amplifier depending on a predetermined condition;
   first signal level detection means of detecting a first signal level that is the signal level of said input signal, or the signal level of a baseband signal in a baseband signal generating portion, or the signal level of a transmitting signal in a transmitting circuit, or the signal level of a received signal in a receiving circuit; and
   second signal level detection means of detecting a second signal level that is the signal level of said output signal, wherein said predetermined condition represents gain of said second signal level to said first signal level, and when said gain is out of a predetermined value, said control means stops the operation of said main amplifier.

2. The feedforward amplifier according to claim 1, wherein said distortion suppression power-combiner is a variable power-combiner that can have a tight coupling state and a loose coupling state, and when said first signal level is higher than a predetermined value, said control means controls said variable power-combiner to have said loose coupling state, and when said first signal level is not higher than the predetermined value, said control means controls said variable power-combiner to have said tight coupling state.

3. The feedforward amplifier according to claim 1, wherein said distortion suppression power-combiner is a variable power-combiner that can have a tight coupling state and a loose coupling state, when said first signal level is lower than a predetermined value, said control means controls said variable power-combiner to have said loose coupling state, and when said first signal level is not lower than the predetermined value, said control means controls said variable power-combiner to have said tight coupling state.

4. The feedforward amplifier according to claim 1, wherein, when said first signal level is not higher than a predetermined value, said control means performs such control that the output signal of said error amplifier can be output without passing through said distortion suppression power-combiner.

5. The feedforward amplifier according to claim 1, wherein, when said first signal level is not lower than a predetermined value, said control means performs such control that the output signal of said error amplifier can be output without passing through said distortion suppression power-combiner.

6. A feedforward amplifier comprising:

a first power splitter for splitting an input signal into two parts;

a first vector adjustor for adjusting the amplitude and phase of one output signal of said first power splitter;

a main amplifier for amplifying an output signal of said first vector adjustor;

a second power splitter for splitting an output signal of said main amplifier into two parts;

a first delay circuit for delaying the other output signal of said first power splitter;

a distortion detection power-combiner for synthesizing one output signal of said second power splitter and an output signal of said first delay circuit;

a second delay circuit for delaying the other output signal of said second power splitter;

a second vector adjustor for adjusting the amplitude and phase of the output signal of said distortion detection power-combiner;

an error amplifier for amplifying the output signal of said second vector adjustor;

a distortion suppression power-combiner for synthesizing the output signal of said second delay circuit and the output signal of said error amplifier;

control means of at least stopping the operation of said error amplifier or said main amplifier depending on a predetermined condition;

a third power splitter for splitting the output signal of said error amplifier into two parts;

a third delay circuit for delaying one output signal of said third power splitter;

a fourth power splitter for splitting the output signal of said distortion suppression power-combiner into two parts;

a fourth delay circuit for delaying one output signal of said fourth power splitter;

a second distortion detection power-combiner for synthesizing the output signal of said fourth delay circuit and the other output signal of said third power splitter;

a third vector adjustor for adjusting the amplitude and phase of the output signal of said second distortion detection power-combiner;

a second error amplifier for amplifying the output signal of said third vector adjustor;

a second distortion suppression power-combiner for synthesizing the output signal of said third delay circuit and the output signal of said second error amplifier; and first signal level detection means of detecting a first signal level that is the signal level of said input signal, or the signal level of a baseband signal in a baseband signal generating portion, or the signal of a transmitting signal in a transmitting circuit, wherein said control means also stops the operation of said second error amplifier depending on said predetermined condition, said predetermined condition represents said first signal level, and when said first signal level is higher than a predetermined value, said control means stops the operation of said second error amplifier and performs such control that the output signal of said error amplifier can not be input by said third power splitter, and performs such control that the output signal of said distortion suppression power-combiner can be output to the outside, and when said first signal level is not higher than the predetermined value, said control means stops the operation of said main amplifier and performs such control that the output signal of said error amplifier can not be input by said distortion suppression power-combiner but can be input by said third power splitter, and performs such control that the output signal of said second distortion suppression power-combiner can be output to the outside.

7. A feedforward amplifier comprising:

a first power splitter for splitting an input signal into two parts;

a first vector adjustor for adjusting the amplitude and phase of one output signal of said first power splitter;

a main amplifier for amplifying an output signal of said first vector adjustor;

a second power splitter for splitting an output signal of said main amplifier into two parts;

a first delay circuit for delaying the other output signal of said first power splitter;

a distortion detection power-combiner for synthesizing one output signal of said second power splitter and an output signal of said first delay circuit;

a second delay circuit for delaying the other output signal of said second power splitter;

a second vector adjustor for adjusting the amplitude and phase of the output signal of said distortion detection power-combiner;

an error amplifier for amplifying the output signal of said second vector adjustor;

a distortion suppression power-combiner for synthesizing the output signal of said second delay circuit and the output signal of said error amplifier;

control means of at least stopping the operation of said error amplifier or said main amplifier depending on a predetermined condition;

a third power splitter for splitting the output signal of said error amplifier into two parts;

a third delay circuit for delaying one output signal of said third power splitter;

a fourth power splitter for splitting the output signal of said distortion suppression power-combiner into two parts;

a fourth delay circuit for delaying one output signal of said fourth power splitter;

a second distortion detection power-combiner for synthesizing the output signal of said fourth delay circuit and the other output signal of said third power splitter;

a third vector adjustor for adjusting the amplitude and phase of the output signal of said second distortion detection power-combiner;

a second error amplifier for amplifying the output signal of said third vector adjustor;

a second distortion suppression power-combiner for synthesizing the output signal of said third delay circuit and the output signal of said second error amplifier; and first signal level detection means of detecting a first signal level that is the signal level of a received signal in a receiving circuit, wherein said control means also stops the operation of said second error amplifier depending on said predetermined condition, said predetermined condition represents said first signal level, and when said first signal level is lower than a predetermined value, said control means stops the operation of said second error amplifier and performs such control that the output signal of said error amplifier can not be input by said third power splitter, and performs such control that the output signal of said distortion suppression power-combiner can be output to the outside, and when said first signal level is not lower than the predetermined value, said control means stops the operation of said main amplifier and performs such control that the output signal of said error amplifier can not be input by said distortion suppression power-combiner but can be input by said third power splitter, and performs such control that the output signal of said second distortion suppression power-combiner can be output to the outside.

8. A feedforward amplifier comprising:

a first power splitter for splitting an input signal into two parts;

a first vector adjustor for adjusting the amplitude and phase of one output signal of said first power splitter;

a main amplifier for amplifying an output signal of said first vector adjustor;

a second power splitter for splitting an output signal of said main amplifier into two parts;

a first delay circuit for delaying the other output signal of said first power splitter;

a distortion detection power-combiner for synthesizing one output signal of said second power splitter and an output signal of said first delay circuit;

a second delay circuit for delaying the other output signal of said second power splitter;

a second vector adjustor for adjusting the amplitude and phase of the output signal of said distortion detection power-combiner;

an error amplifier for amplifying the output signal of said second vector adjustor;

a distortion suppression power-combiner for synthesizing the output signal of said second delay circuit and the output signal of said error amplifier;

control means of at least stopping the operation of said error amplifier or said main amplifier depending on a predetermined condition;

a third power splitter for splitting the output signal of said error amplifier into two parts;

a third delay circuit for delaying one output signal of said third power splitter;

a fourth power splitter for splitting the output signal of said distortion suppression power-combiner into two parts;

a fourth delay circuit for delaying one output signal of said fourth power splitter;

a second distortion detection power-combiner for synthesizing the output signal of said fourth delay circuit and the other output signal of said third power splitter;

a third vector adjustor for adjusting the amplitude and phase of the output signal of said second distortion detection power-combiner;

a second error amplifier for amplifying the output signal of said third vector adjustor;

a second distortion suppression power-combiner for synthesizing the output signal of said third delay circuit and the output signal of said second error amplifier; and first signal level detection means of detecting a first signal level that is the signal level of said input signal, or the signal level of a baseband signal in a baseband signal generating portion, or the signal of a transmitting signal in a transmitting circuit, wherein said control means also stops the operation of said second error amplifier depending on said predetermined condition, said predetermined condition represents said first signal level, and when said first signal level is higher than a predetermined value, said control means stops the operation of said second error amplifier and performs such control that the output signal of said error amplifier can not be input by said third power splitter, and performs such control that the output signal of said distortion suppression power-combiner can be output to the outside, and when said first signal level is not higher than the first predetermined value and higher than a second predetermined value that is smaller than said first predetermined value, said control means stops the operation of said main amplifier and performs such control that the output signal of said error amplifier can not be input by said distortion suppression power-combiner but can be input by said third power splitter, and performs such control that the output signal of said second distortion suppression power-combiner can be output to the outside, and when said first signal level is not higher than the second predetermined value, said control means stops the operation of said error amplifier and stops the operation of said second error amplifier, and performs such control that the output signal of said distortion suppression power-combiner can be output to the outside.

9. A feedforward amplifier comprising:

a first power splitter for splitting an input signal into two parts;

a first vector adjustor for adjusting the amplitude and phase of one output signal of said first power splitter;

a main amplifier for amplifying an output signal of said first vector adjustor;

a second power splitter for splitting an output signal of said main amplifier into two parts;

a first delay circuit for delaying the other output signal of said first power splitter;

a distortion detection power-combiner for synthesizing one output signal of said second power splitter and an output signal of said first delay circuit;

a second delay circuit for delaying the other output signal of said second power splitter;

a second vector adjustor for adjusting the amplitude and phase of the output signal of said distortion detection power-combiner;

an error amplifier for amplifying the output signal of said second vector adjustor;

a distortion suppression power-combiner for synthesizing the output signal of said second delay circuit and the output signal of said error amplifier;

control means of at least stopping the operation of said error amplifier or said main amplifier depending on a predetermined condition;

a third power splitter for splitting the output signal of said error amplifier into two parts;

a third delay circuit for delaying one output signal of said third power splitter;

a fourth power splitter for splitting the output signal of said distortion suppression power-combiner into two parts;

a fourth delay circuit for delaying one output signal of said fourth power splitter;

a second distortion detection power-combiner for synthesizing the output signal of said fourth delay circuit and the other output signal of said third power splitter;

a third vector adjustor for adjusting the amplitude and phase of the output signal of said second distortion detection power-combiner;

a second error amplifier for amplifying the output signal of said third vector adjustor;

a second distortion suppression power-combiner for synthesizing the output signal of said third delay circuit and the output signal of said second error amplifier; and first signal level detection means of detecting a first signal level that is the signal level of a received signal in a receiving circuit, wherein said control means also stops the operation of said second error amplifier depending on said predetermined condition, said predetermined condition represents said first signal level, and when said first signal level is lower than a second predetermined value, said control means stops the operation of said second error amplifier and performs such control that the output signal of said error amplifier can not be input by said third power splitter, and performs such control that the output signal of said distortion suppression power-combiner can be output to the outside, and when said first signal level is not higher than a first predetermined value that is larger than said second predetermined value and higher than said second pre-determined value, said control means stops the operation of said main amplifier and performs such control that the output signal of said error amplifier can not be input by said distortion suppression power-combiner but can be input by said third power splitter, and performs such control that the output signal of said second distortion suppression power-combiner can be output to the outside, and when said first signal level is not lower than the first predetermined value, said control means stops the operation of said error amplifier and stops the operation of said second error amplifier, and performs such control that the output signal of said distortion suppression power-combiner can be output to the outside.

10. The feedforward amplifier according to any one of claims 6, and 8, wherein said first signal level detection means is provided in an upstream stage of said first power splitter, or between said first power splitter and said first vector adjustor, or between said first vector adjustor and said main amplifier, or between said first power splitter and said first delay circuit, or between said first delay circuit and said distortion detection power-combiner, or at the input of said baseband signal generating portion, or at the output of said baseband signal generating portion, or in said baseband signal generating potion, or at the input of said transmitting circuit, or at the output of said transmitting circuit, or in said transmitting circuit.

11. The feedback amplifier according to any one of claims 1, 7, and 9, wherein said first signal level detection means is provided at the input of said receiving circuit, or at the output of said receiving circuit, or in said receiving circuit.

12. The feedforward amplifier according to claim 1, wherein said second signal level detection means is provided in a downstream stage of said distortion suppression power-combiner, or between said second power splitter and said second delay circuit, or between said second delay circuit and said distortion suppression power-combiner.

13. The feedforward amplifier according to claim 10, wherein said first signal level is the signal level of said input signal, and when said first signal level detection means detects the signal level of said input signal, said first signal level detection means has a signal level detection power-splitter for splitting said input signal into two parts and detection means of detecting said signal level of one output signal of said signal level detection power-splitter, and the other output signal of said signal level detection power splitter is supplied to a downstream stage.

14. The feedforward amplifier according to claim 12, wherein said second signal level detection means has a signal level detection power-splitter for splitting said output signal into two parts and detection means of detecting said signal level of one output signal of said signal level detection power-splitter, and the other output signal of said signal level detection power-splitter is supplied to a downstream stage.

15. The feedforward amplifier according to any one of claims 8, and 9, wherein the stopping of the operation of said error amplifier is to perform such control that the power supply for said error amplifier can be turned off and/or to perform such control that the output signal of said second vector adjustor can not be input by said error amplifier.

16. The feedforward amplifier according to any one of claims 6, 7, 8, and 9, wherein the stopping of the operation of said main amplifier is to perform such control that the power supply for said main amplifier can be turned off and/or to perform such control that the output signal of said first vector adjustor can not be input by said main amplifier.

17. The feedforward amplifier according to any one of claims 6, 7, 8, and 9, wherein the stopping of the operation of said second error amplifier is to perform such control that the power supply for said second error amplifier can be turned off and/or to perform such control that the output signal of said third vector adjustor can not be input by said secondary error amplifier.

18. A communication equipment comprising:
a baseband generating portion for generating a baseband signal; and
a transmitting circuit for outputting a transmitting signal from said baseband signal generated, wherein the feedforward amplifier according to any one of claims 1, 6 to 9, 12, and 14 is used for said transmitting circuit.

* * * * *

UNITED STATES PATENT AND TRADEMARK OFFICE
CERTIFICATE OF CORRECTION

PATENT NO. : 6,710,652 B2 Page 1 of 1
DATED : March 23, 2004
INVENTOR(S) : Miyaji et al.

It is certified that error appears in the above-identified patent and that said Letters Patent is hereby corrected as shown below:

Column 32,
Lines 16 and 64, after "claims" insert -- 1, --.

Signed and Sealed this

Thirtieth Day of November, 2004

JON W. DUDAS
*Director of the United States Patent and Trademark Office*